(12) United States Patent
Liang et al.

(10) Patent No.: US 10,854,506 B2
(45) Date of Patent: Dec. 1, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chun-Sheng Liang, Changhua County (TW); Wei-Chih Kao, Taipei (TW); Hsin-Che Chiang, Taipei (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/224,155

(22) Filed: Dec. 18, 2018

(65) Prior Publication Data

US 2020/0105577 A1    Apr. 2, 2020

Related U.S. Application Data

(60) Provisional application No. 62/737,867, filed on Sep. 27, 2018.

(51) Int. Cl.
*H01L 23/522* (2006.01)
*H01L 23/528* (2006.01)
(Continued)

(52) U.S. Cl.
CPC .... *H01L 21/7682* (2013.01); *H01L 21/76802* (2013.01); *H01L 21/76831* (2013.01);
(Continued)

(58) Field of Classification Search
CPC ......... H01L 21/7682; H01L 21/76802–76817; H01L 21/823431; H01L 21/823821; H01L 21/845; H01L 23/5226; H01L 23/5283; H01L 27/0886; H01L 27/0924; H01L 27/1211; H01L 29/1037; H01L 29/41791; H01L 29/66795; H01L 29/66803; H01L 29/6681; H01L 29/66818; H01L 29/785; H01L 29/7851; H01L 29/7853; H01L 29/7854; H01L 29/7855; H01L 29/7856; H01L 29/6656; H01L 29/6653; H01L 2029/7857; H01L 2029/7858; H01L 2221/1042; H01L 21/76832; H01L 21/76834; H01L 21/764; H01L 21/28247; H01L 21/76897; H01L 2221/1047; H01L 2221/1063; H01L 29/4991; H01L 29/0649;
(Continued)

(56) References Cited

U.S. PATENT DOCUMENTS 6,344,677 B2 *  2/2002  Higuchi ................ H01L 29/665
                                                      257/344
9,105,490 B2    8/2015  Wang et al.
(Continued)

*Primary Examiner* — Yu Chen
(74) *Attorney, Agent, or Firm* — Maschoff Brennan

(57) ABSTRACT

A semiconductor device includes a substrate, a gate stack over the substrate, an insulating structure over the gate stack, a conductive via in the insulating structure, and an contact etch stop layer (CESL) over the insulating structure. The insulating structure has an air slit therein. The conductive via is electrically connected to the gate stack. A portion of the CESL is exposed in the air slit.

20 Claims, 48 Drawing Sheets

(51) Int. Cl.
*H01L 29/49* (2006.01)
*H01L 29/78* (2006.01)
*H01L 21/768* (2006.01)
*H01L 29/66* (2006.01)
*H01L 27/088* (2006.01)
*H01L 27/12* (2006.01)
*H01L 21/8234* (2006.01)

(52) U.S. Cl.
CPC ............... *H01L 21/76843* (2013.01); *H01L 21/823431* (2013.01); *H01L 21/823475* (2013.01); *H01L 21/823481* (2013.01); *H01L 23/5226* (2013.01); *H01L 23/5283* (2013.01); *H01L 27/0886* (2013.01); *H01L 27/1211* (2013.01); *H01L 29/66795* (2013.01); *H01L 29/785* (2013.01); *H01L 29/7851* (2013.01); H01L 29/6656 (2013.01); H01L 29/66545 (2013.01); H01L 29/66575 (2013.01); H01L 29/66636 (2013.01); H01L 29/7848 (2013.01); H01L 2029/7858 (2013.01); H01L 2221/1042 (2013.01); H01L 2221/1063 (2013.01)

(58) Field of Classification Search
CPC ............. H01L 29/515; H01L 29/66515; H01L 29/66545; H01L 29/41775; H01L 29/41783

See application file for complete search history.

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu |
| 9,831,183 B2 | 11/2017 | Lin et al. |
| 9,859,386 B2 | 1/2018 | Ho et al. |
| 2012/0037962 A1* | 2/2012 | Breyta ............... H01L 23/4821 257/288 |
| 2012/0104512 A1* | 5/2012 | Horak ............... H01L 29/4983 257/401 |
| 2016/0329237 A1* | 11/2016 | Chen ............... H01L 21/76816 |
| 2017/0330832 A1* | 11/2017 | He ............... H01L 23/5222 |

* cited by examiner

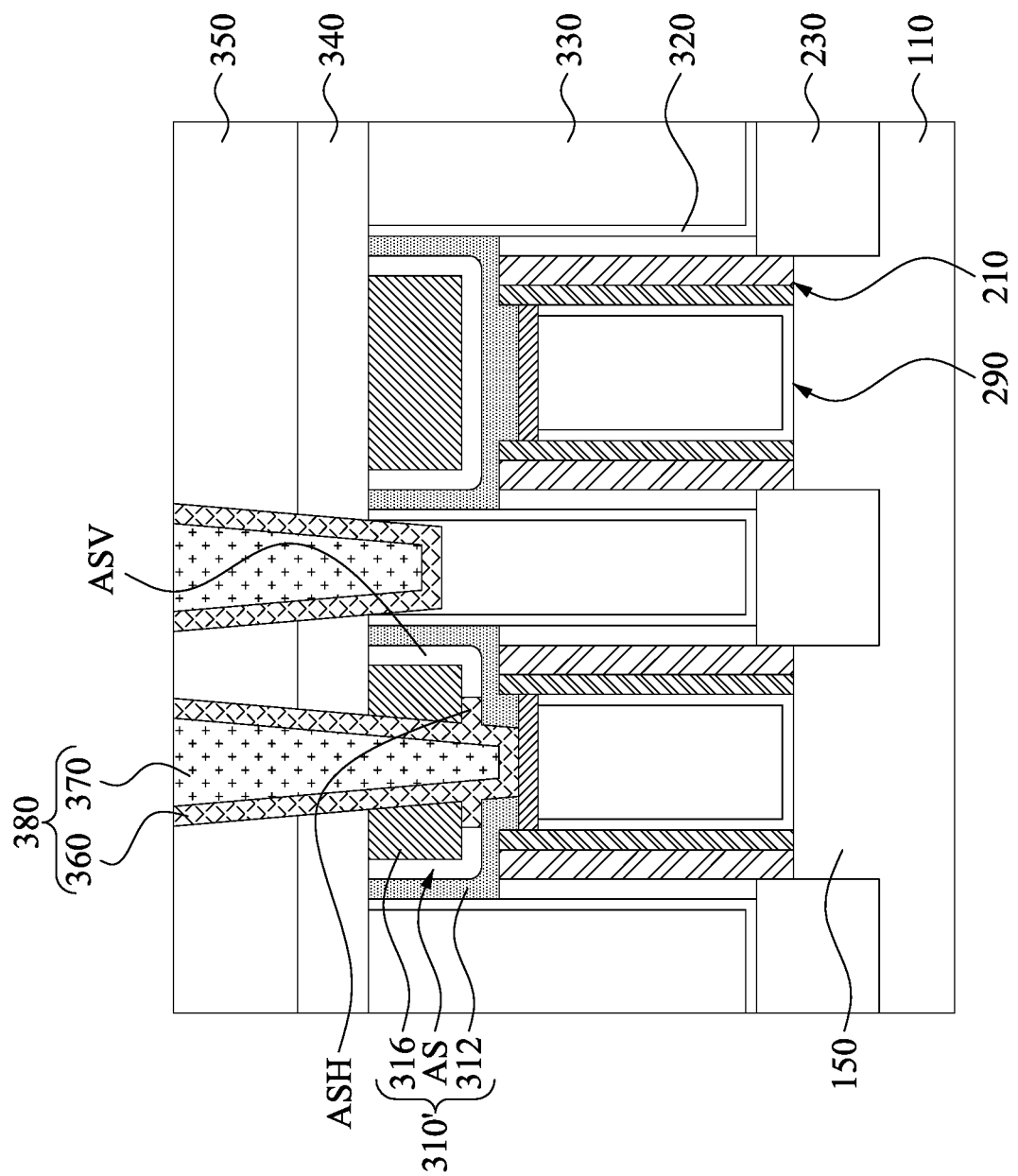

SEMICONDUCTOR DEVICE AND MANUFACTURING METHOD THEREOF

PRIORITY CLAIM AND CROSS-REFERENCE

This application claims priority to U.S. Provisional Application Ser. No. 62/737,867, filed Sep. 27, 2018, which is herein incorporated by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
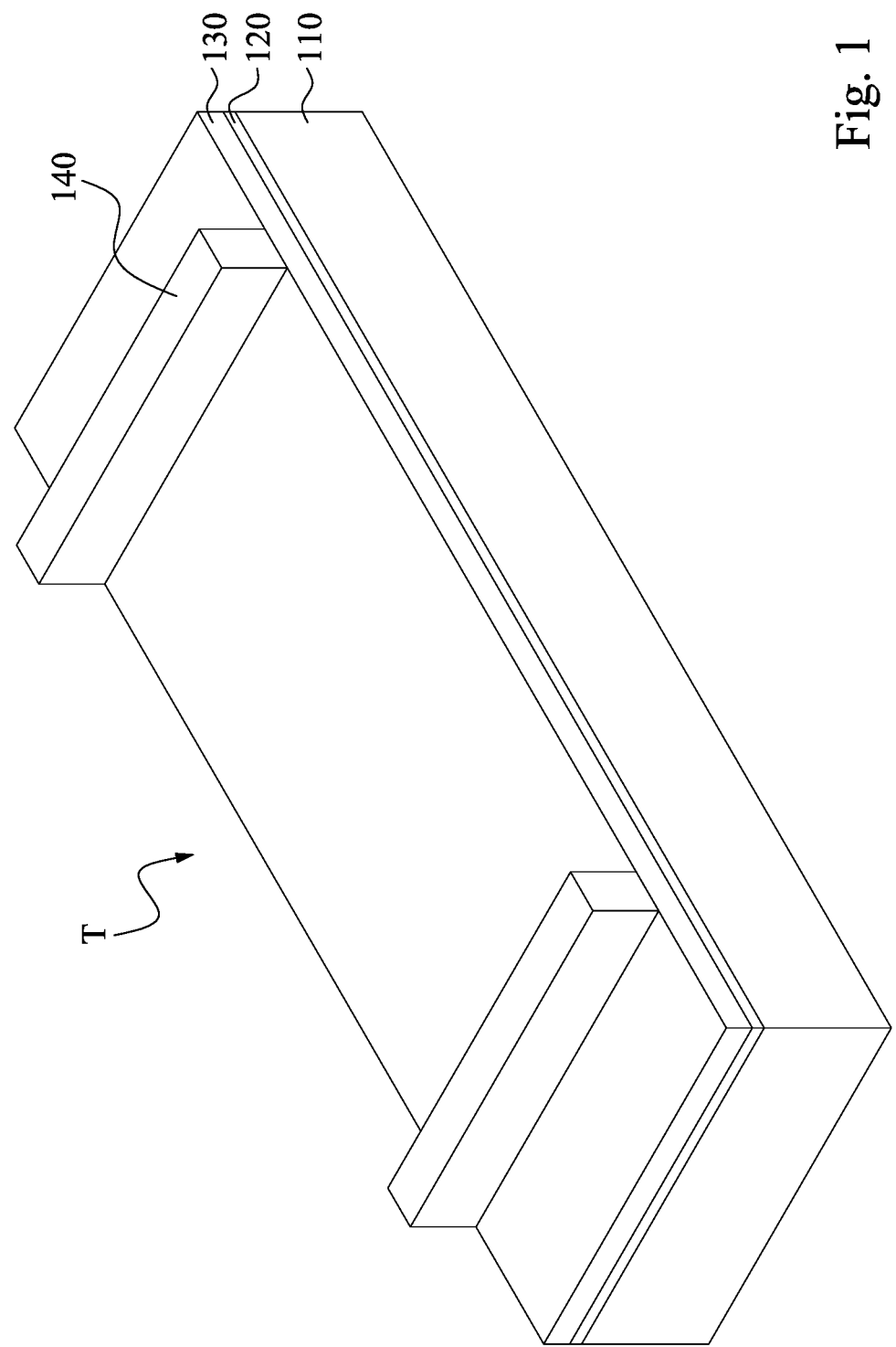
FIGS. 1 to 25C illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1 to 25C illustrate a method for manufacturing a semiconductor device at various stages in accordance with some embodiments of the present disclosure. Reference is made to FIG. 1. A substrate 110 is illustrated, and it may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A pad layer 120 and a mask layer 130 are formed on the substrate 110. The pad layer 120 may be a thin film comprising silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. A photo-sensitive layer 140 is formed on the mask layer 130 and is then patterned, forming openings in the photo-sensitive layer 140, so that some regions of the mask layer 130 are exposed.

Figure 2:
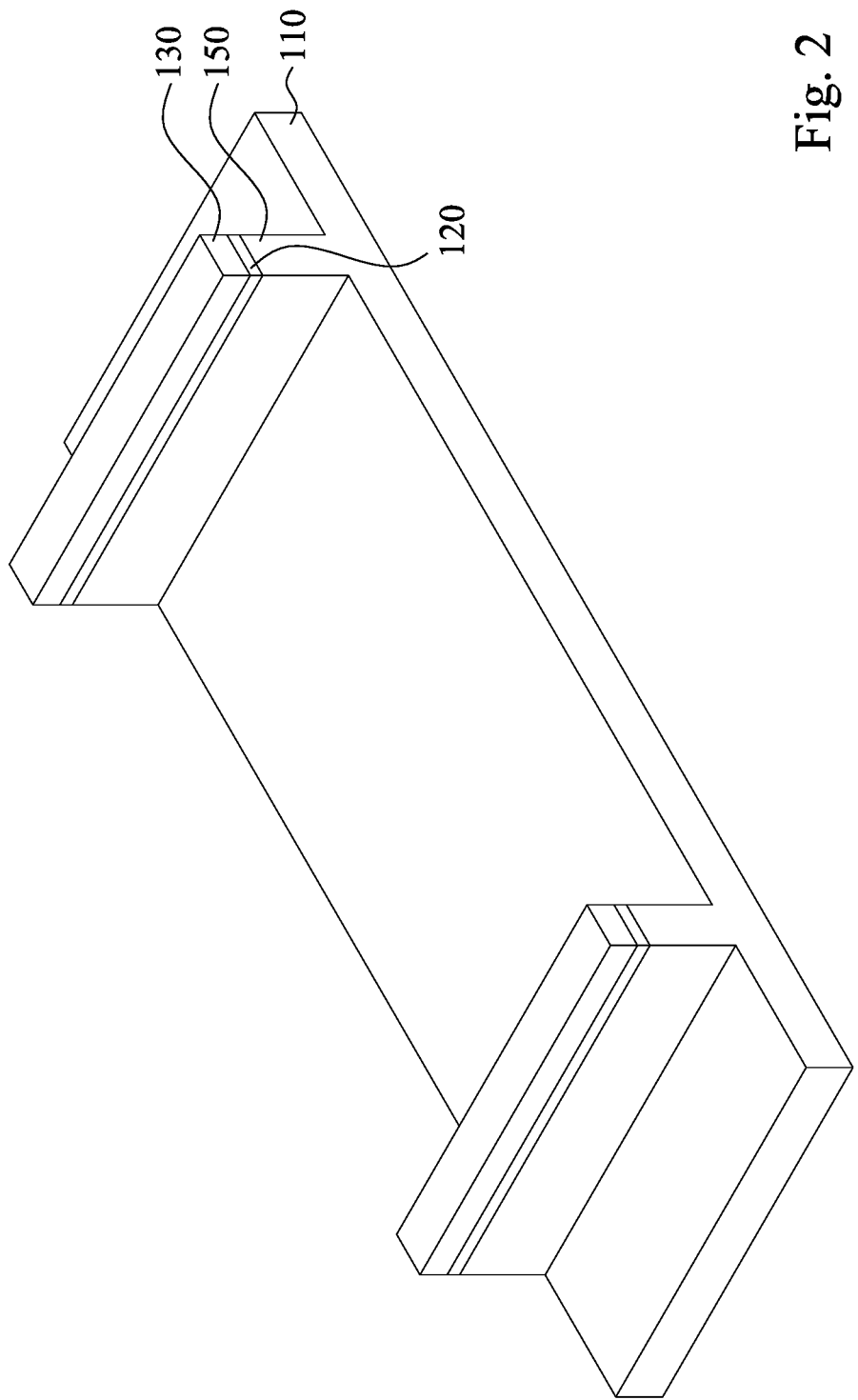

Reference is made to FIG. 2. The mask layer 130 and pad layer 120 are etched through the photo-sensitive layer 140, exposing underlying substrate 110. The exposed substrate 110 is then etched, forming trenches T. A portion of the substrate 110 between neighboring trenches T can be referred to as a semiconductor fin 150. Trenches T may be trench strips that are substantially parallel to each other. Similarly, the semiconductor fins are substantially parallel to each other. After etching the substrate 110, the photo-sensitive layer 140 is removed. Next, a cleaning step may be performed to remove a native oxide of the semiconductor substrate 110. The cleaning may be performed using diluted hydrofluoric (HF) acid, for example.

Figure 3:
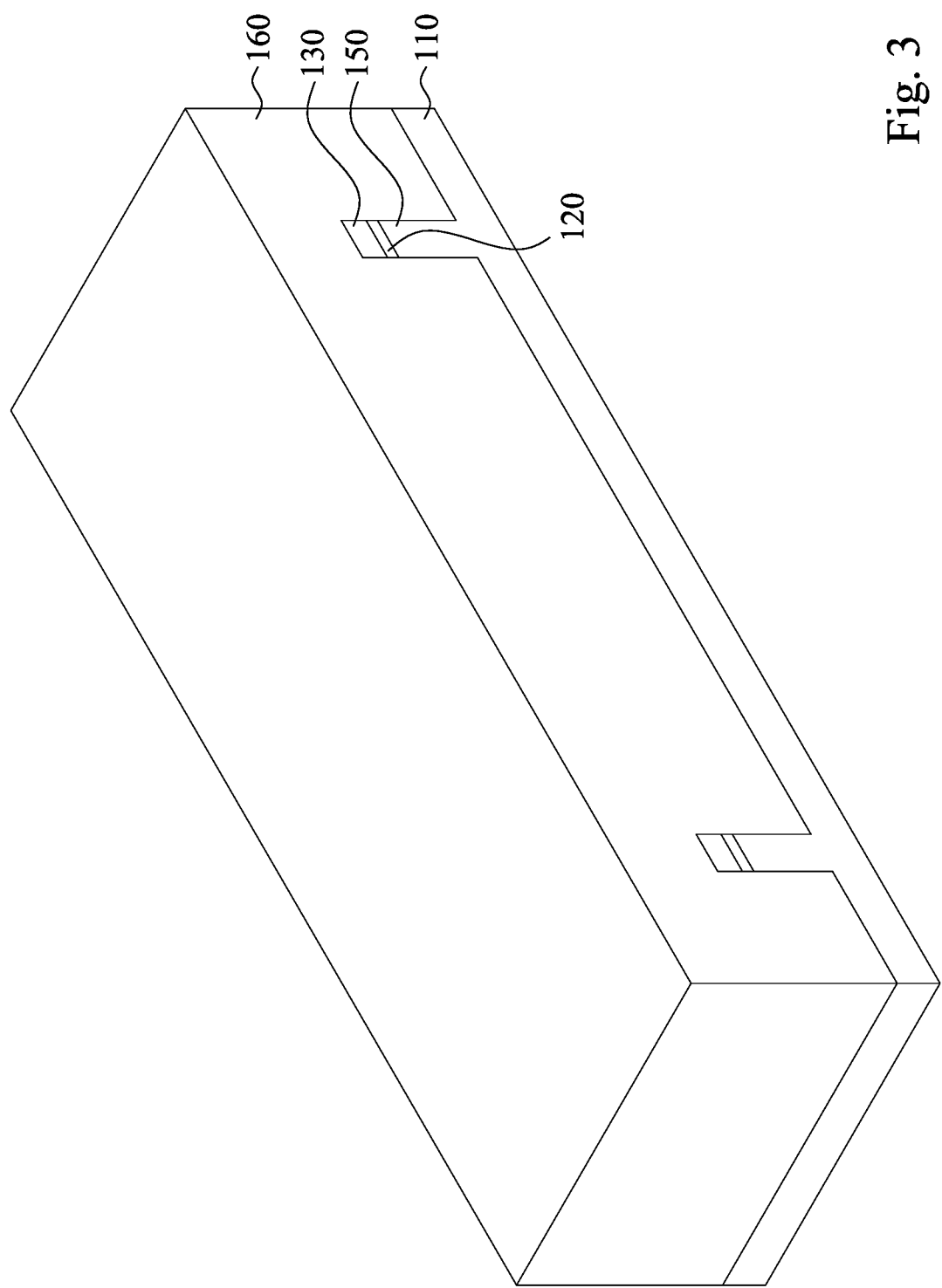

After photo-sensitive layer 140 is removed, an isolation dielectric 160 is formed to cover the semiconductor fin 150 over substrate 110, the isolation dielectric 160 may overfill the trenches T, and the resulting structure is shown in FIG. 3. The isolation dielectric 160 in the trenches T can be referred to as a shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the isolation dielectric 160.

Figure 4:
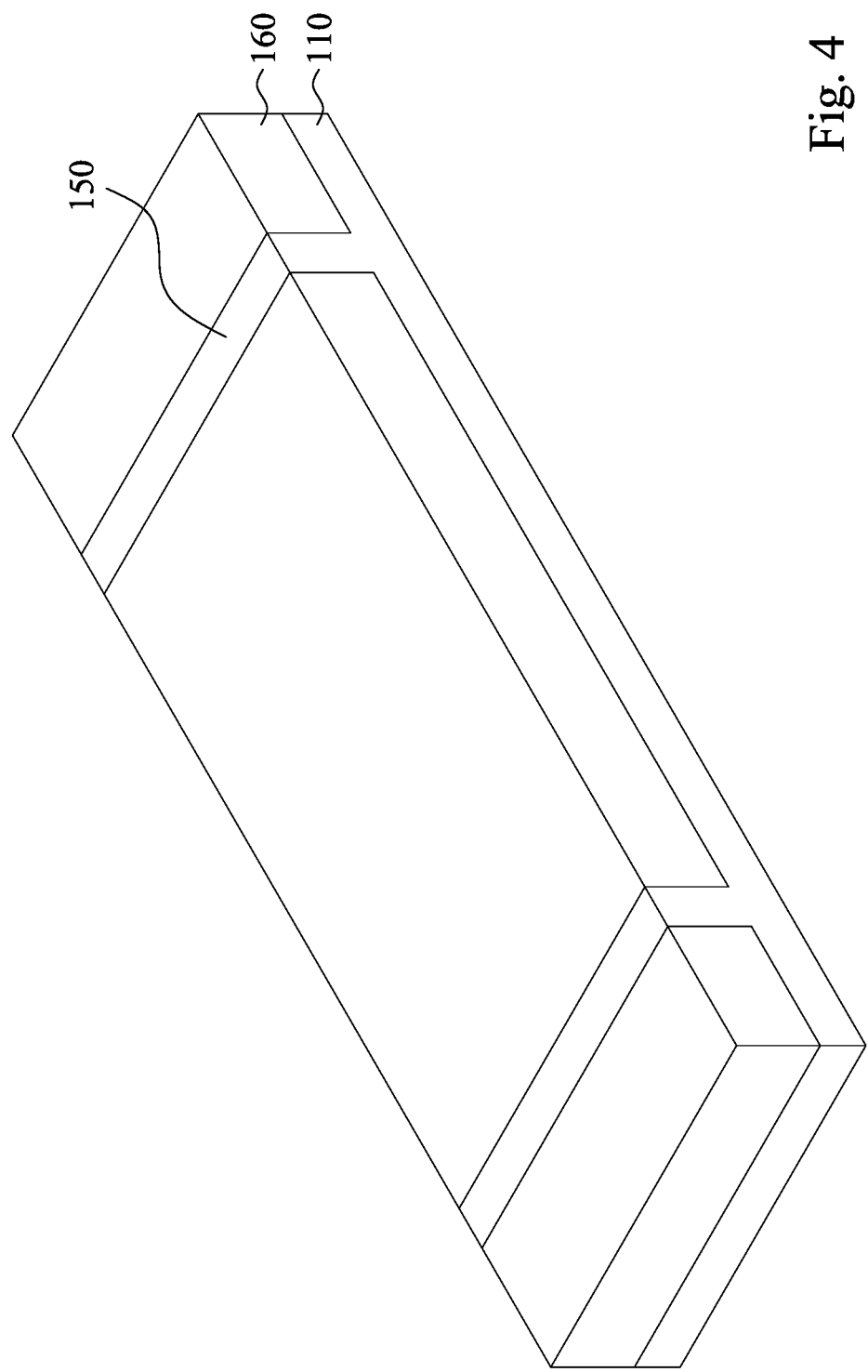

Next, a planarization process such as chemical mechanical polish (CMP) is then performed to remove the excess isolation dielectric 160 outside the trenches T, and the resulting structure is shown in FIG. 4. In some embodiments, the planarization process may also remove the mask layer 130 and the pad layer 120 such that top surfaces of the semiconductor fins 150 are exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 5:
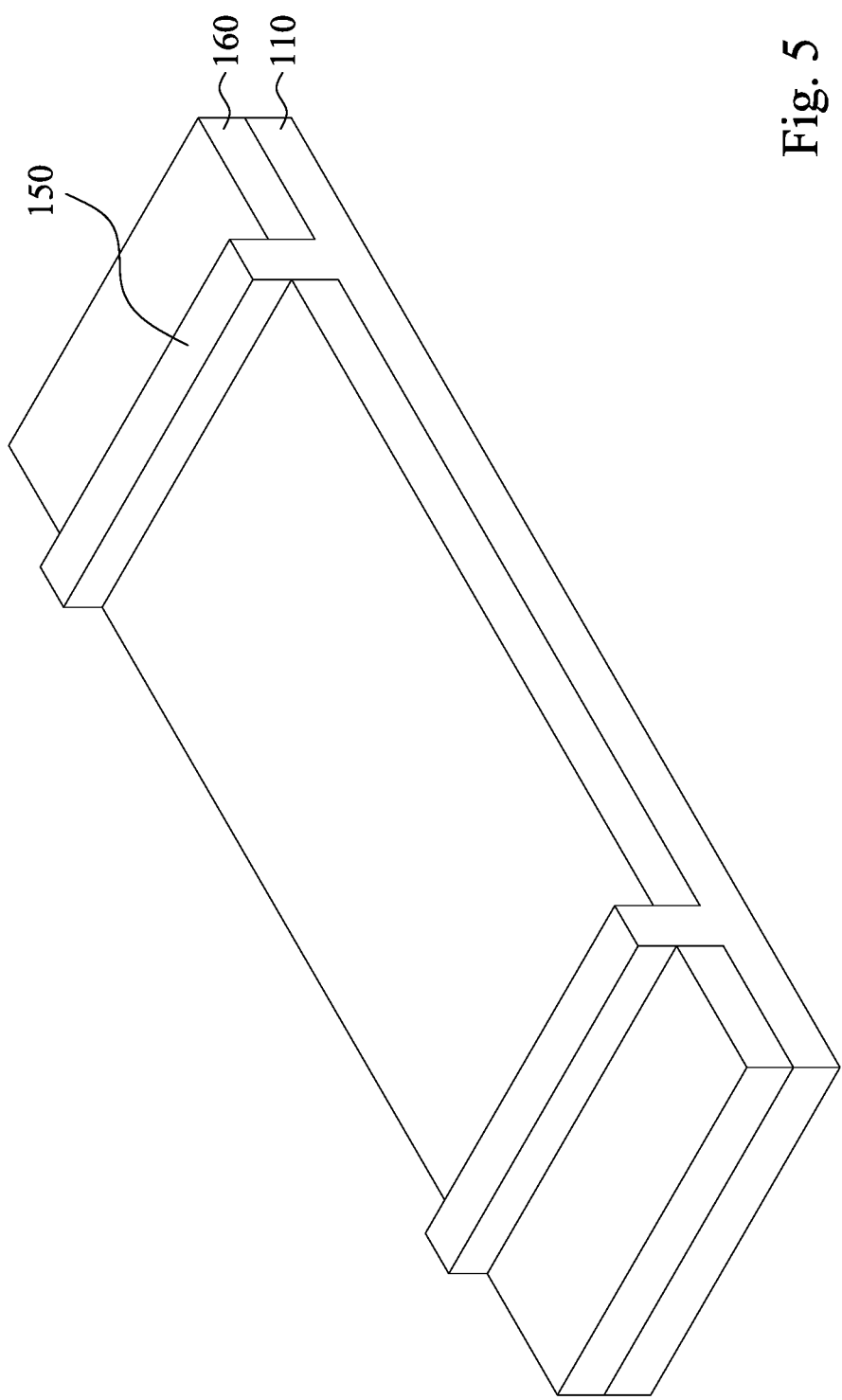

Next, as shown in FIG. 5, the isolation dielectric 160 is recessed, for example, through an etching operation, wherein diluted HF, SiCoNi (including HF and $NH_3$), or the like, may be used as the etchant. After recessing the isolation dielectric 160, a portion of the semiconductor fin 150 is higher than a top surface of the isolation dielectric 160, and hence this portion of the semiconductor fin 150 protrudes above the isolation dielectric 160.

It is understood that the processes described above are some examples of how semiconductor fins 150 and the STI structure are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, at least one of the semiconductor fins 150 can be recessed, and a material different from the recessed semiconductor fin 150 may be epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. In some embodiments, at least one of the semiconductor fins 150 may include silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
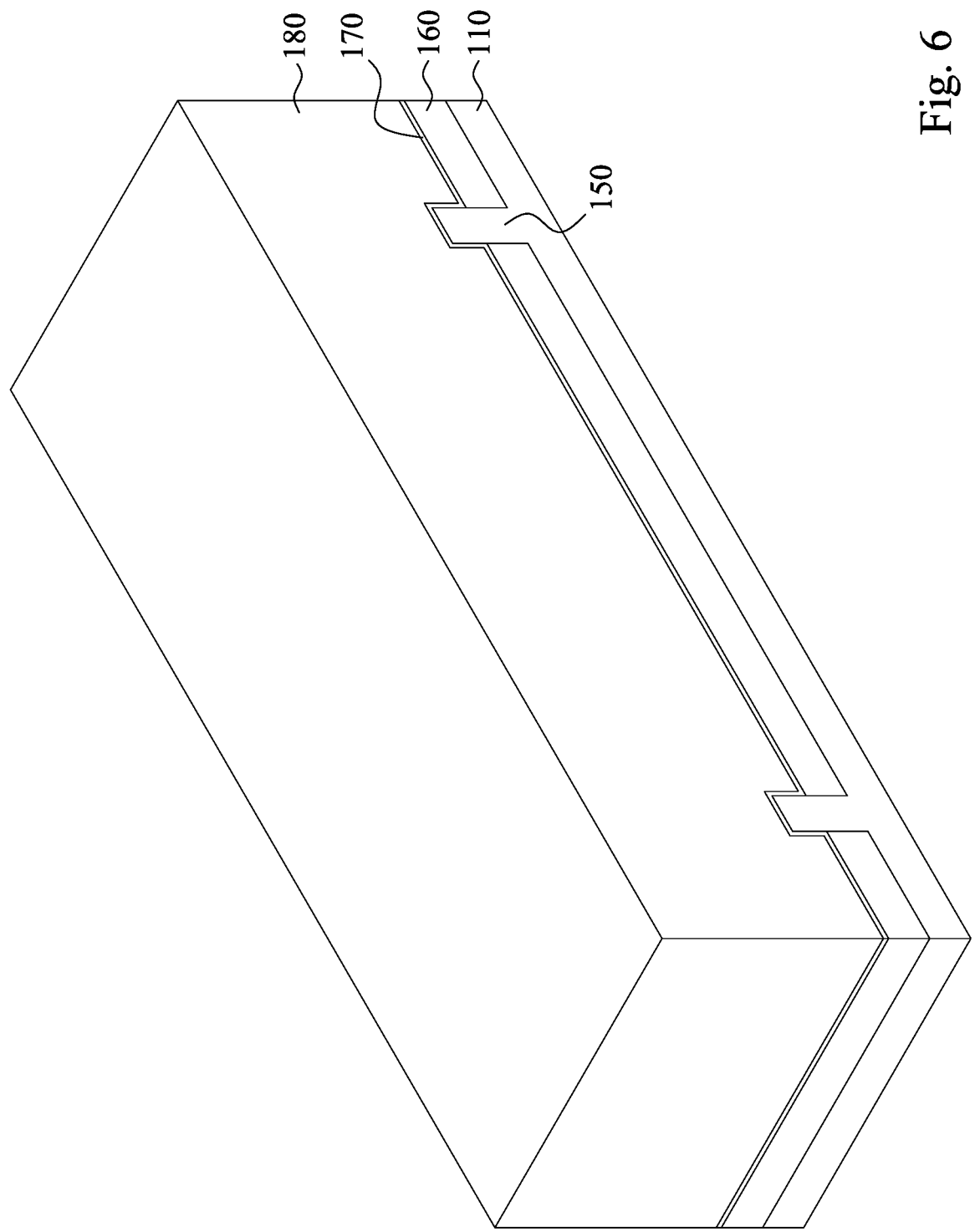

Reference is made to FIG. 6. A gate dielectric layer 170 is blanket formed over the substrate 110 to cover the semiconductor fins 150 and the isolation dielectric 160. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 170 is formed, a dummy gate electrode layer 180 is formed over the gate dielectric layer 170. In some embodiments, the dummy gate electrode layer 180 may include polycrystalline-silicon (poly-Si), poly-crystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 7:
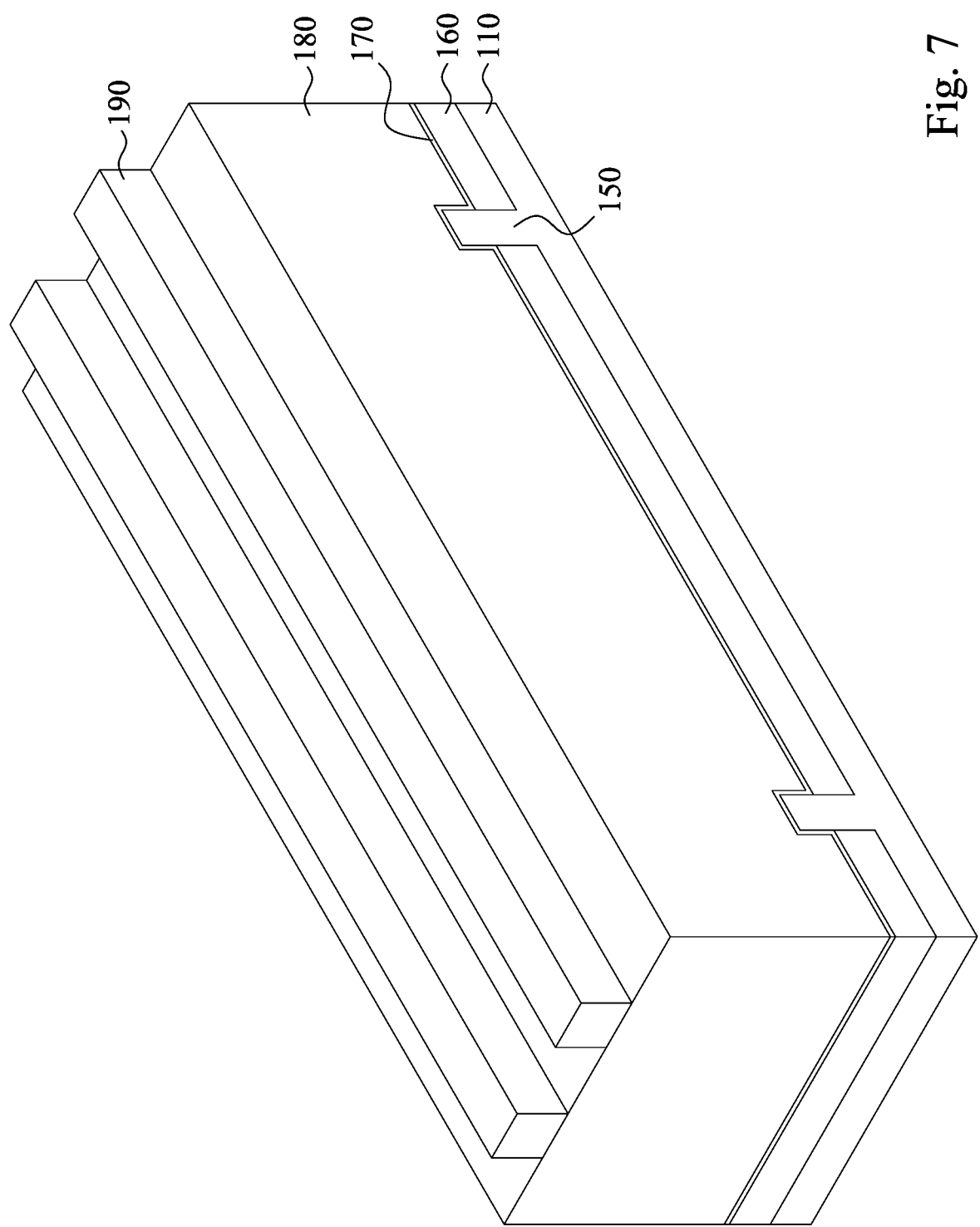

Next, the dummy gate electrode layer 180 and the gate dielectric layer 170 are patterned to form dummy gate structures in accordance with some embodiments. For example, a patterned mask 190 is formed over a portion of the dummy gate electrode layer 180, as shown in FIG. 7. The mask 190 may be a hard mask for protecting the underlying dummy gate electrode layer 180 and the gate dielectric layer 170 against subsequent etching process. The patterned mask 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 8:
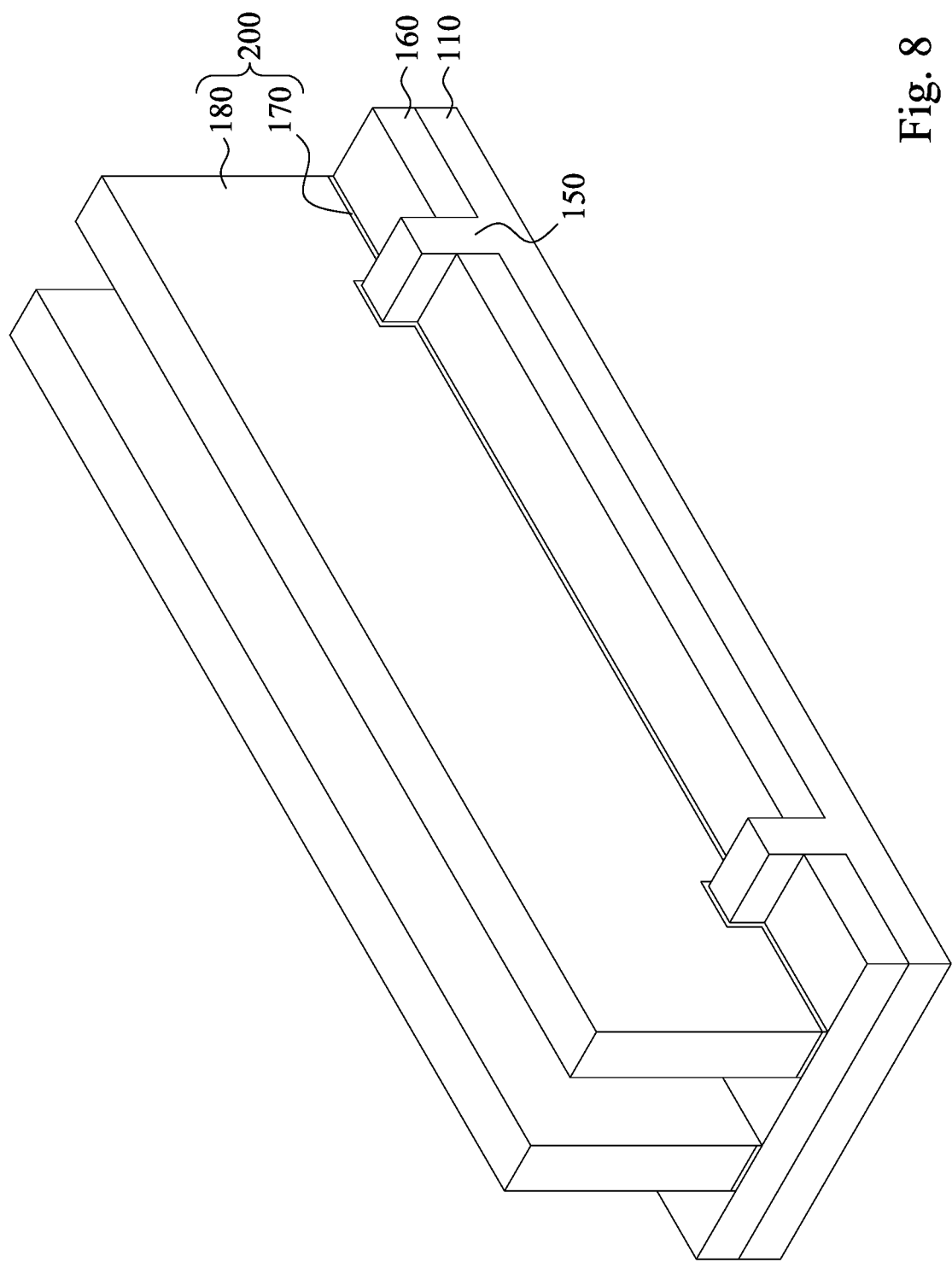

An etching process is performed to form dummy gate structures 200 wrapping the semiconductor fins 150 using the patterned mask 190 as an etching mask, and the patterned mask 190 is removed after the etching. The resulting structure is shown in FIG. 8. Each dummy gate structure 200 includes a gate dielectric layer 170 and a dummy gate electrode layer 180 over the gate dielectric layer 170. The dummy gate structures 200 have substantially parallel longitudinal axes that are substantially perpendicular to longitudinal axes of the semiconductor fins 150, as illustrated in FIG. 8. The dummy gate structures 200 will be replaced with a replacement gate structure using a "gate-last" or replacement-gate process.

Figure 9:
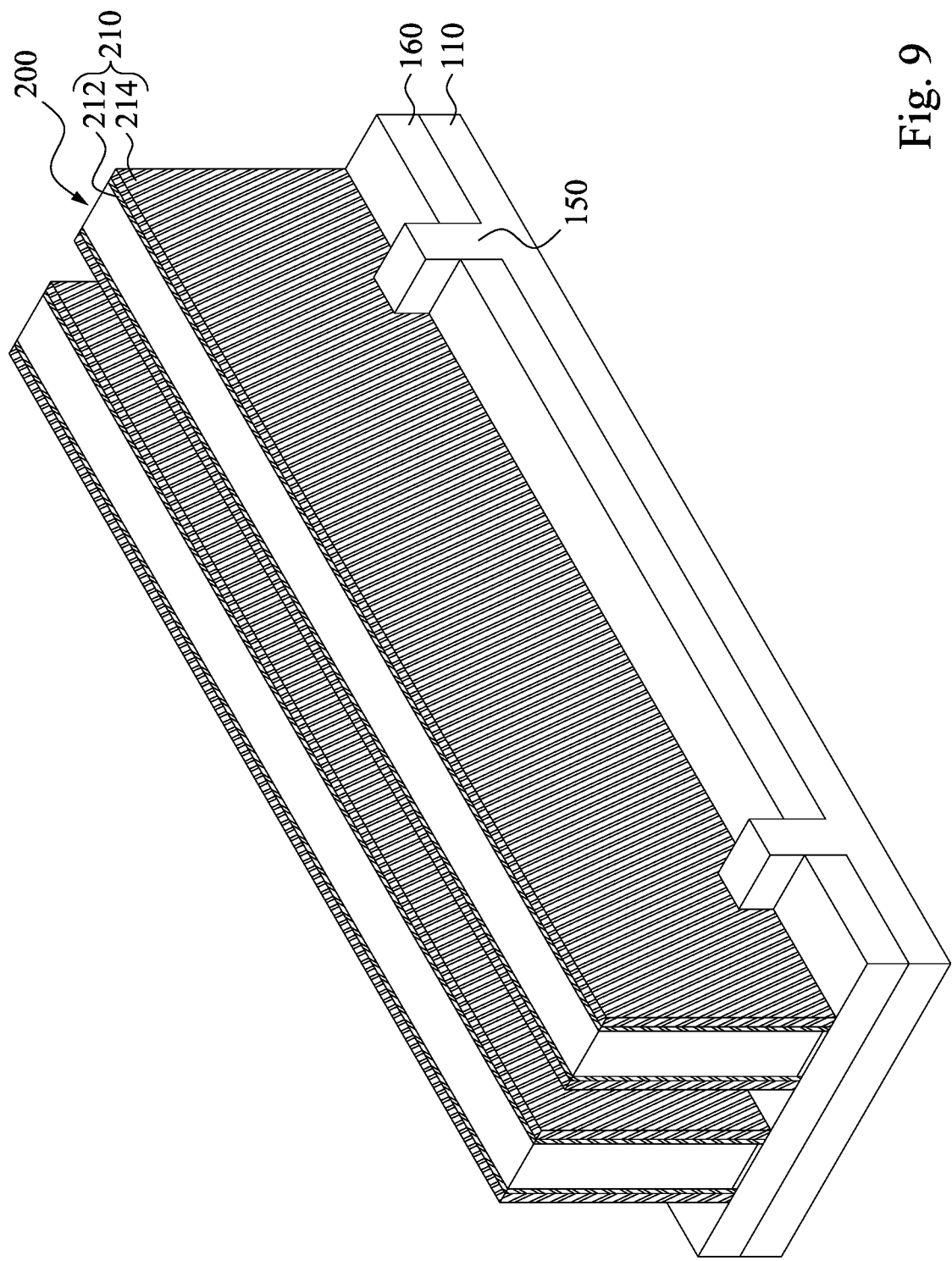

Reference is made to FIG. 9. Gate spacers 210 are formed on opposite sidewalls of the dummy gate structures 200. In some embodiments, the gate spacers 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 210 may include a single layer or multilayer structure made of different dielectric materials. The method of forming the gate spacers 210 includes blanket forming a dielectric layer on the structure shown in FIG. 8 using, for example, CVD, PVD or ALD, and then performing an etching process such as anisotropic etching to remove horizontal portions of the dielectric layer. The remaining portions of the dielectric layer on sidewalls of the dummy gate structures 200 can serve as the gate spacers 210. In some embodiments, the gate spacers 210 may be used to offset subsequently formed doped regions, such as source/drain regions. The gate spacers 210 may further be used for designing or modifying the source/drain region profile. In some embodiments shown in FIG. 9, each of the gate spacers 210 is a multilayered structure that includes a first layer 212 and a second layer 214. For example, the first layer 212 and the second layer 214 may include SiO, SiN, SiOC, and SiOCN. In other embodiments, the each of the gate spacers 210 is a single-layer structure. That is, one of the first layer 212 and the second layer 214 may be omitted. In some embodiments, each of the gate spacers 210 includes three layers.

Figure 10:
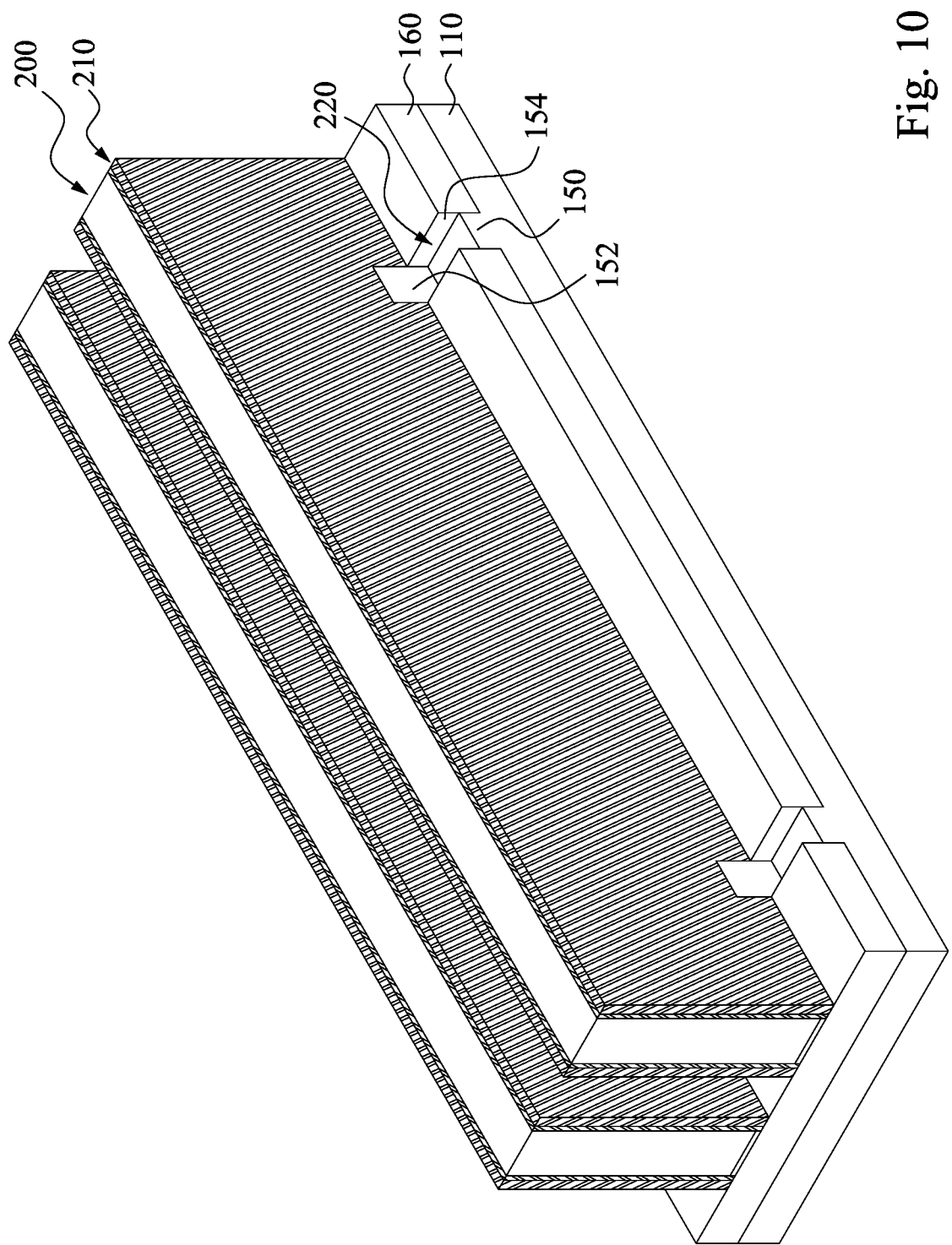

Reference is made to FIG. 10. Portions of the semiconductor fins 150 not covered by the dummy gate structures 200 and the gate spacers 210 are respectively partially removed (or partially recessed) to form recesses 220. The remaining semiconductor fin 150 may have a protruding portion 152 and embedded portions 154 after this removal. The embedded portions 154 are embedded in the isolation dielectric 160, and the embedded portions 154 are exposed by the recesses 220. The protruding portion 152 protrudes from the embedded portions 154 and is located between the recesses 220. The dummy gate structures 200 wrap the protruding portions 152, and hence the protruding portions 152 can act as channel regions of transistors. The embedded portions 154 spaced apart from the dummy gate structures 200 can act as source/drain regions of transistors.

Formation of the recesses 220 may include a dry etching process, a wet etching process, or combination dry and wet etching processes. This etching process may include reactive ion etch (RIE) using the dummy gate structures 200 and gate spacers 210 as masks, or by any other suitable removal process. In some embodiments, the etching process may be performed, for example, under a pressure of about 1 mTorr to 1000 mTorr, a power of about 10 W to 1000 W, a bias voltage of about 20 V to 500 V, at a temperature of about 40° C. to 60° C., using a HBr and/or $Cl_2$ as etch gases. After the etching process, a pre-cleaning process may be performed to clean the recesses 220 with hydrofluoric acid (HF) or other suitable solution in some embodiments.

Figure 11:
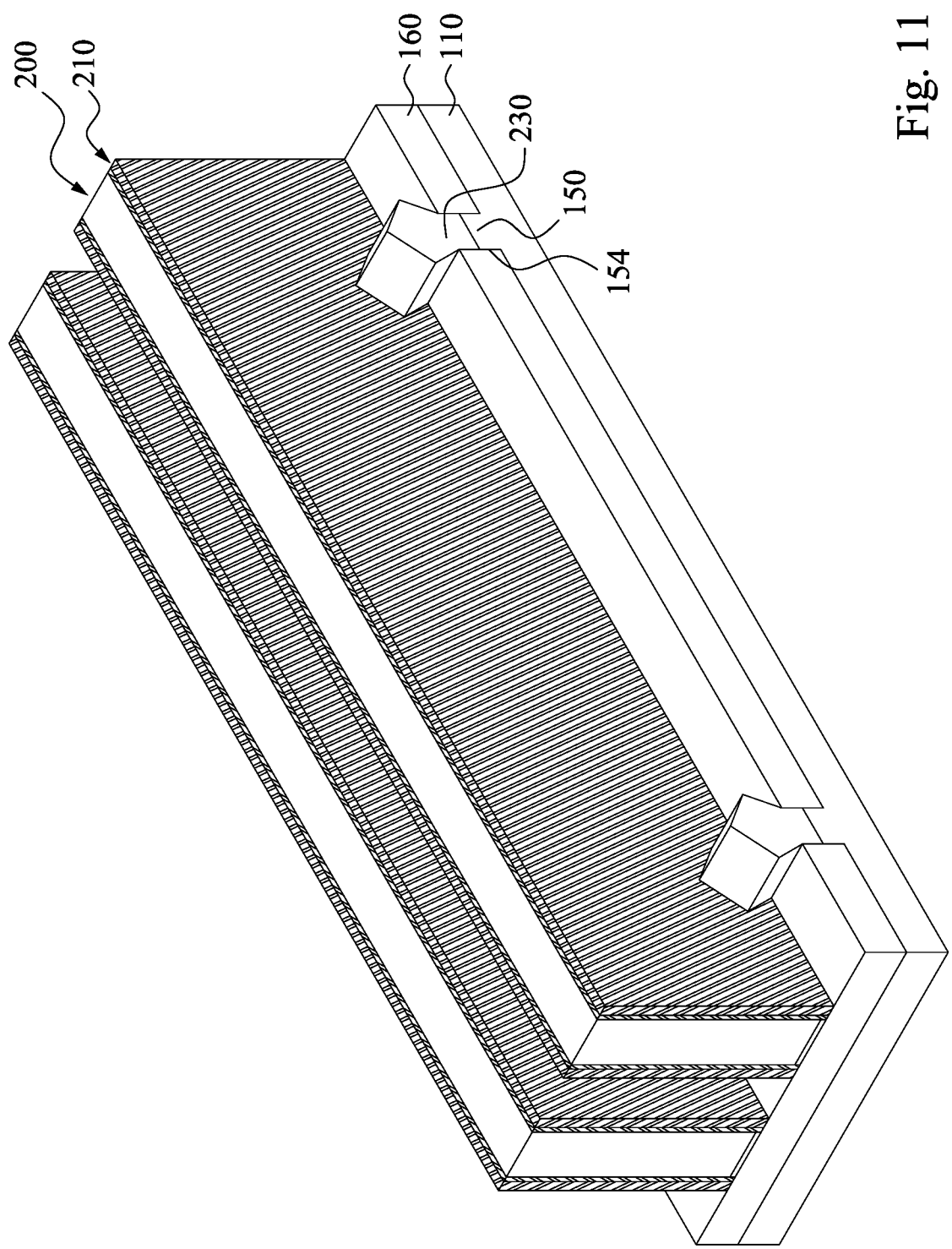

Reference is made to FIG. 11. Epitaxial source/drain structures 230 are respectively formed in the recesses 220. The epitaxial source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions 154 of the semiconductor fins 150. In some embodiments, lattice constants of the epitaxial source/drain structures 230 are different from that of the semiconductor fins 150, so that the channel region between the epitaxial source/drain structures 230 can be strained or stressed by the epitaxial source/drain structures 230 to improve carrier mobility of the semiconductor device and enhance the device performance.

Specifically, the electron mobility increases and the hole mobility decreases when the tensile strain is applied in the channel region, and the electron mobility decreases and the hole mobility increases when the compress strain is applied in the channel region. Therefore, an n-type transistor with a stressor configured to provide tensile strain in the channel region would be beneficial, and a p-type transistor with a stressor configured to provide compress strain in the channel region would be beneficial as well. For example, in some embodiments where two source/drain structures 230 are used to form an n-type transistor, the source/drain structures 230 can act as stressors including, for example, SiP, SiC or SiCP, which is able to induce tensile strain to an n-type channel; in some embodiments where two source/drain structures 230 are used to form a p-type transistor, the source/drain structures 230 may include stressors including SiGe, which is able to induce compress strain to a p-type channel.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 150 (e.g., silicon, silicon germanium, silicon phosphate, or the like). The epitaxial source/drain structures 230 may be in-situ doped. The doping species include p-type dopants, such as boron or $BF_2$; n-type dopants, such as phosphorus or arsenic; and/or other suitable dopants including combinations thereof. If the epitaxial source/drain structures 230 are not in-situ doped, a second implantation process (i.e., a junction implant process) is performed to dope the epitaxial source/drain structures 230. One or more annealing processes may be performed to activate the epitaxial source/drain structures 230. The annealing processes include rapid thermal annealing (RTA) and/or laser annealing processes.

Figure 12:
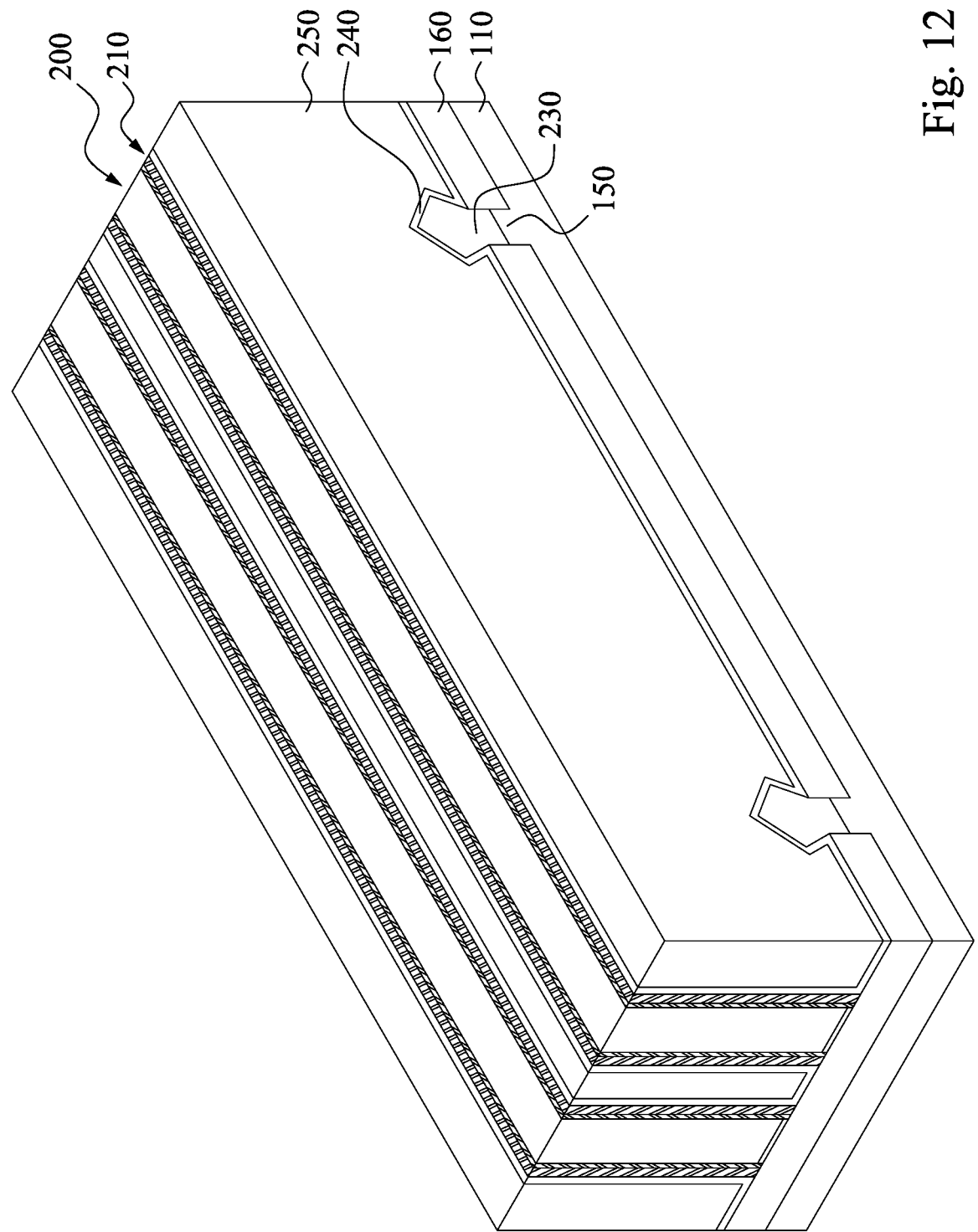

Reference is made to FIG. 12. A contact etch stop layer (CESL) 240 is blanket formed on the structure shown in FIG. 11, and then, an interlayer dielectric (ILD) layer 250 is formed on the CESL 240. Afterwards, a CMP process may be optionally performed to remove excessive materials of the ILD layer 250 and the CESL 240 to expose the dummy gate structures 200. The CMP process may planarize a top surface of the ILD layer 250 with top surfaces of the dummy gate structures 200, gate spacers 210 and the CESL 240 in some embodiments. The CESL 240 may be a dielectric layer including silicon nitride, silicon oxynitride or other suitable materials. The CESL 240 can be formed using, for example, plasma enhanced CVD, low pressure CVD, ALD or other suitable techniques. The ILD layer 250 may include a material different from the CESL 240. In some embodiments, the ILD layer 250 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 250 may be formed using, for example, CVD, ALD, spin-on-glass (SOG) or other suitable techniques.

Figure 13:
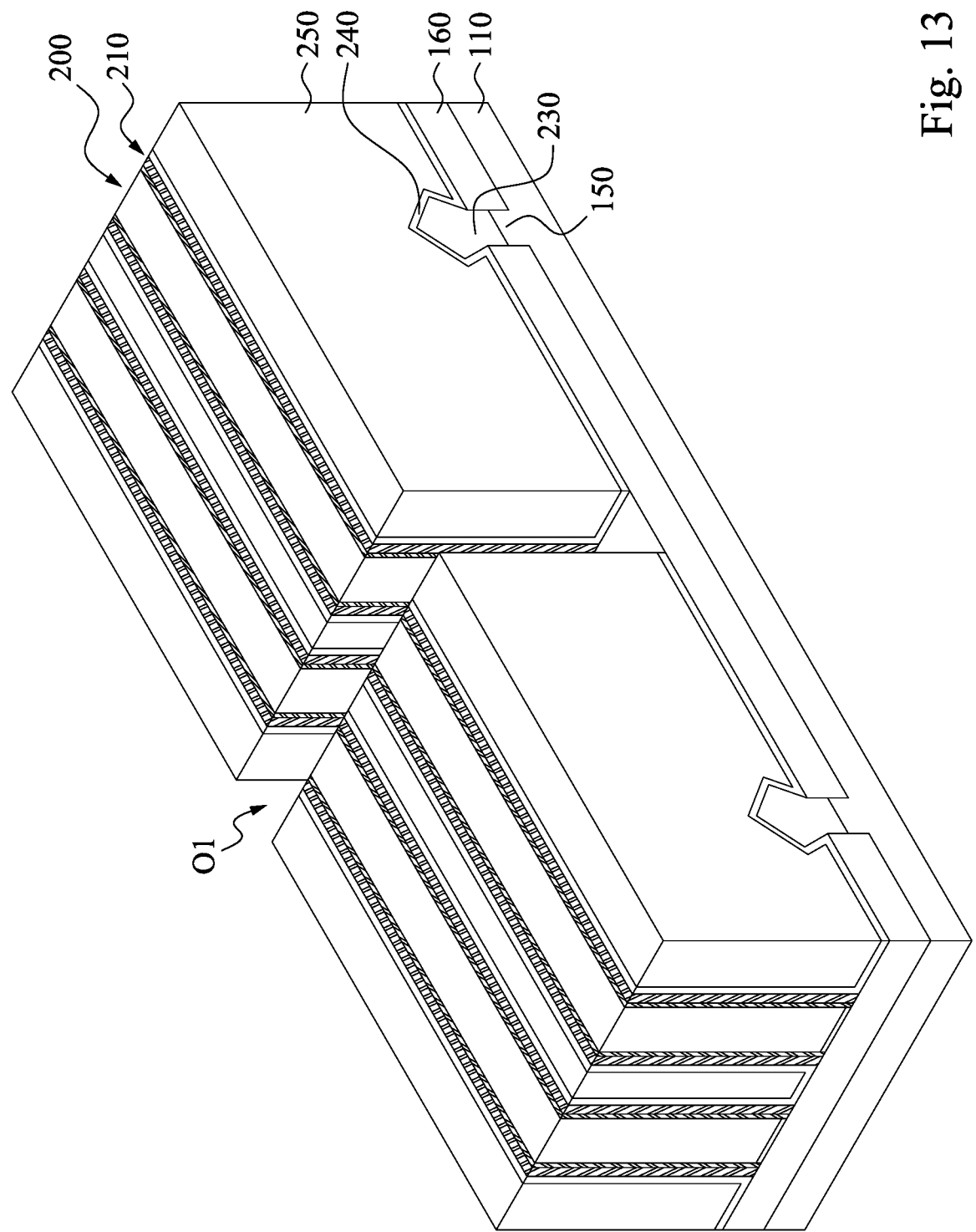

FIG. 13 illustrates cutting or separation of at least one dummy gate structure into individual and separated dummy gate portions in accordance with some embodiments. For example, one or more etching processes are performed to cut the dummy gate structures 200, so that an opening O1 is formed between individual dummy gate portions. During the one or more etching processes, a patterned mask (not shown) can be formed to protect portions of the dummy gate structures 200 that are not to be removed, and the patterned mask can be removed after the one or more etching processes. In some embodiments, as illustrated, portions of gate spacers 210, the CESL 240 and the ILD layer 250 exposed by the patterned mask are removed by the one or more etching processes. In some embodiments where the dummy gate electrodes are formed of polysilicon, the opening O1 can be referred to as cut polysilicon (CPO) regions that cut the polysilicon gates.

Figure 14:
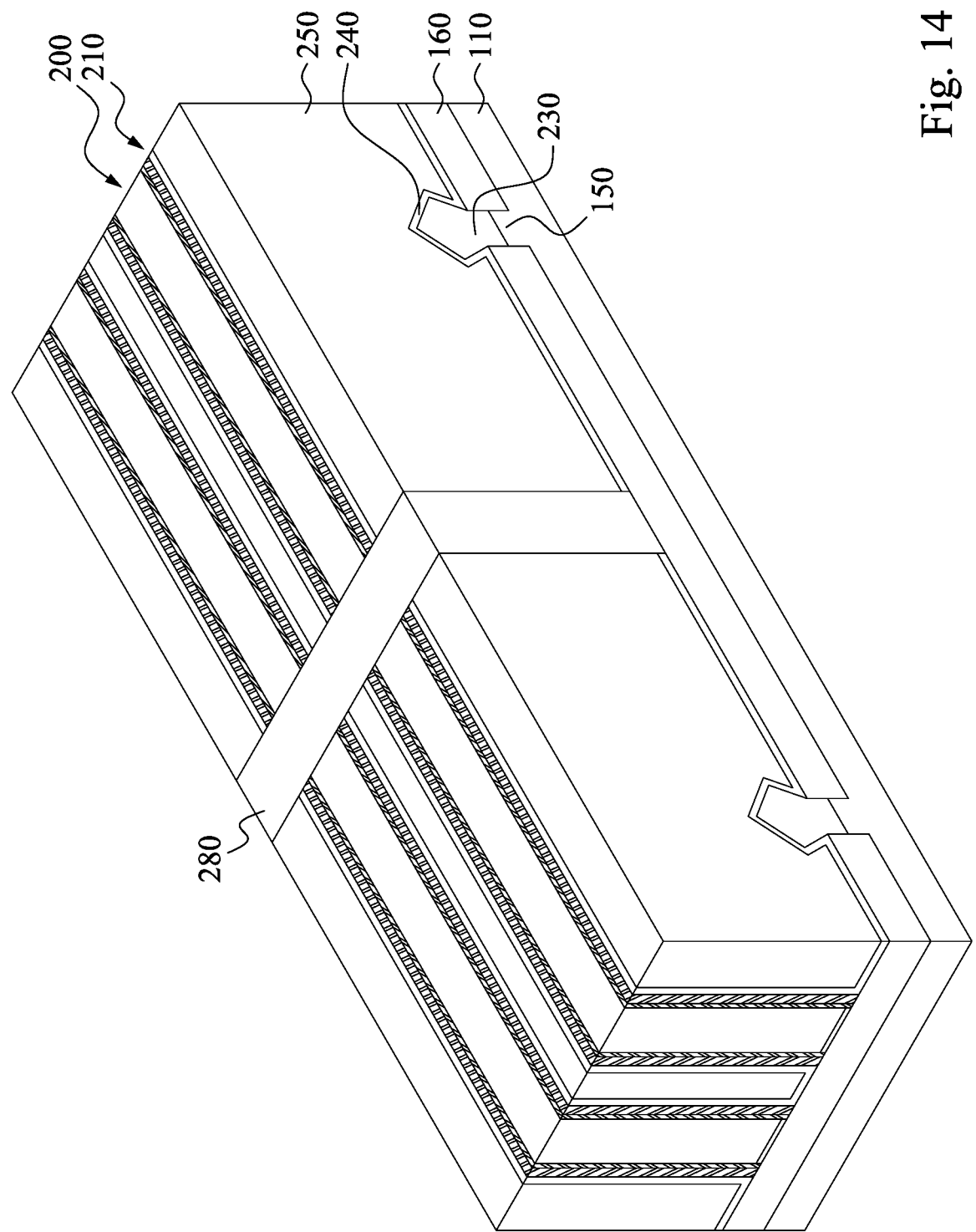

Next, a dielectric feature (or called isolation feature) 280 is then formed to fill the remaining opening O1, and the dielectric feature 280 is thus referred to as a dielectric filling 280. Thereafter, a CMP process is performed to remove excess material of dielectric filling 280 outside the opening O1, and the resulting structure is shown in FIG. 14. The remaining dielectric filling 280 can also be referred to as CPO features 280 in the opening O1.

In some embodiments, the dielectric filling 280 is a flowable dielectric material that can be deposited into the opening 280 using a flowable CVD (FCVD). In some embodiments, the flowable dielectric filling 280 may comprise a flowable oxide such as a flowable silicon oxide. The flowable dielectric filling 280 is formed by using a spin on dielectric (SOD) such as a silicate, a siloxane, a methyl SilsesQuioxane (MSQ), a hydrogen SisesQuioxane (HSQ), an MSQ/HSQ, a perhydrosilazane (TCPS) or a perhydropolysilazane (PSZ). Alternatively, the flowable dielectric filling 280 can be formed by using a low temperature plasma chemical vapor deposition at a temperature less than about 100° C. under a pressure ranging from about 100 mTorr to about 10 Ton. The dielectric filling 280 has a thickness in a range from about 200 angstroms to about 300 angstroms, for example.

Figure 15:
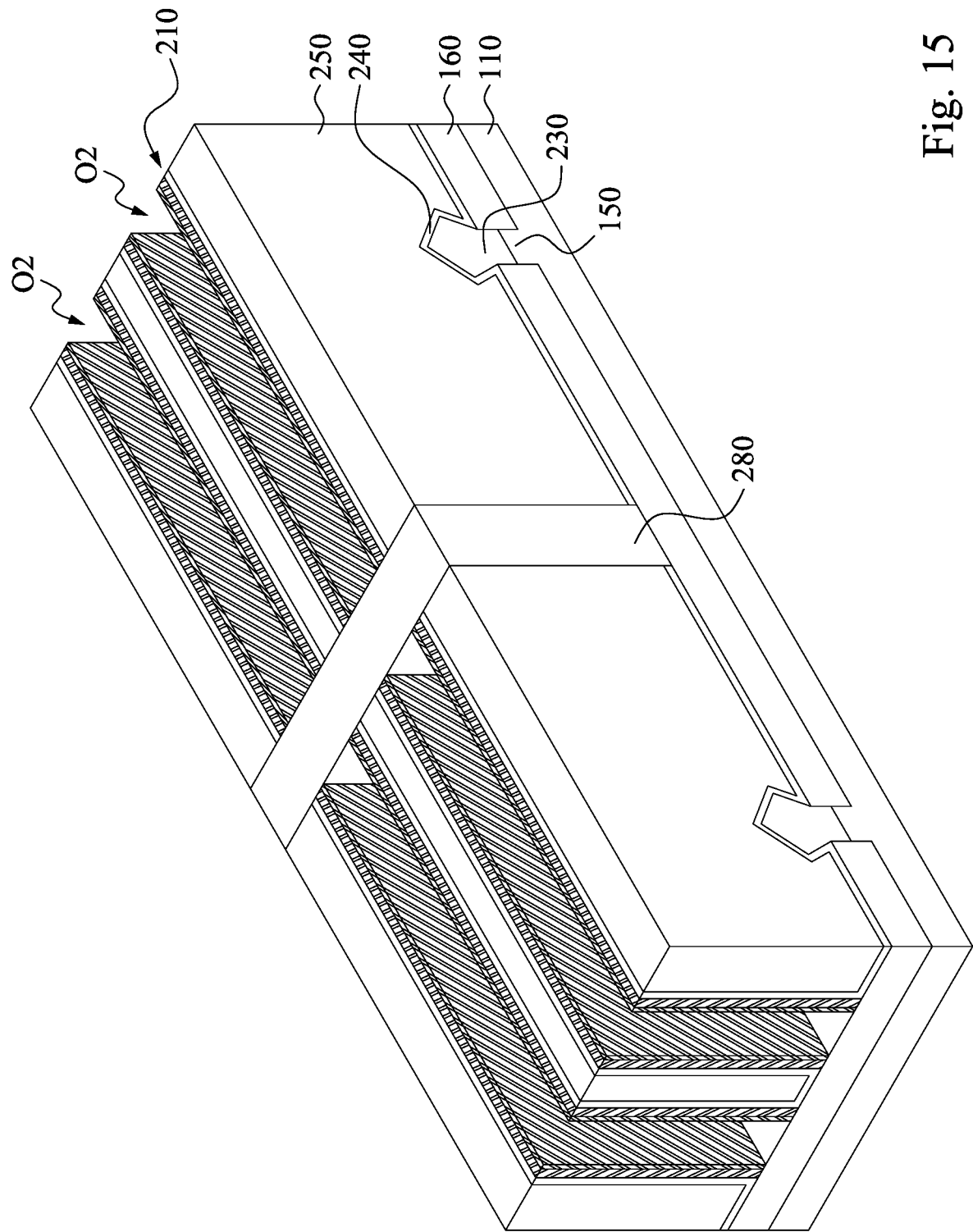

Reference is made to FIG. 15. The dummy gate structures 200 are removed, such that openings O2 are formed between a pair of the gate spacers 210. In some embodiments, the dummy gate structures 200 may be removed by suitable process, such as dry etch, wet etch, or combination thereof. In some embodiments, the openings O2 can also be referred to as gate trenches.

Figure 16A:
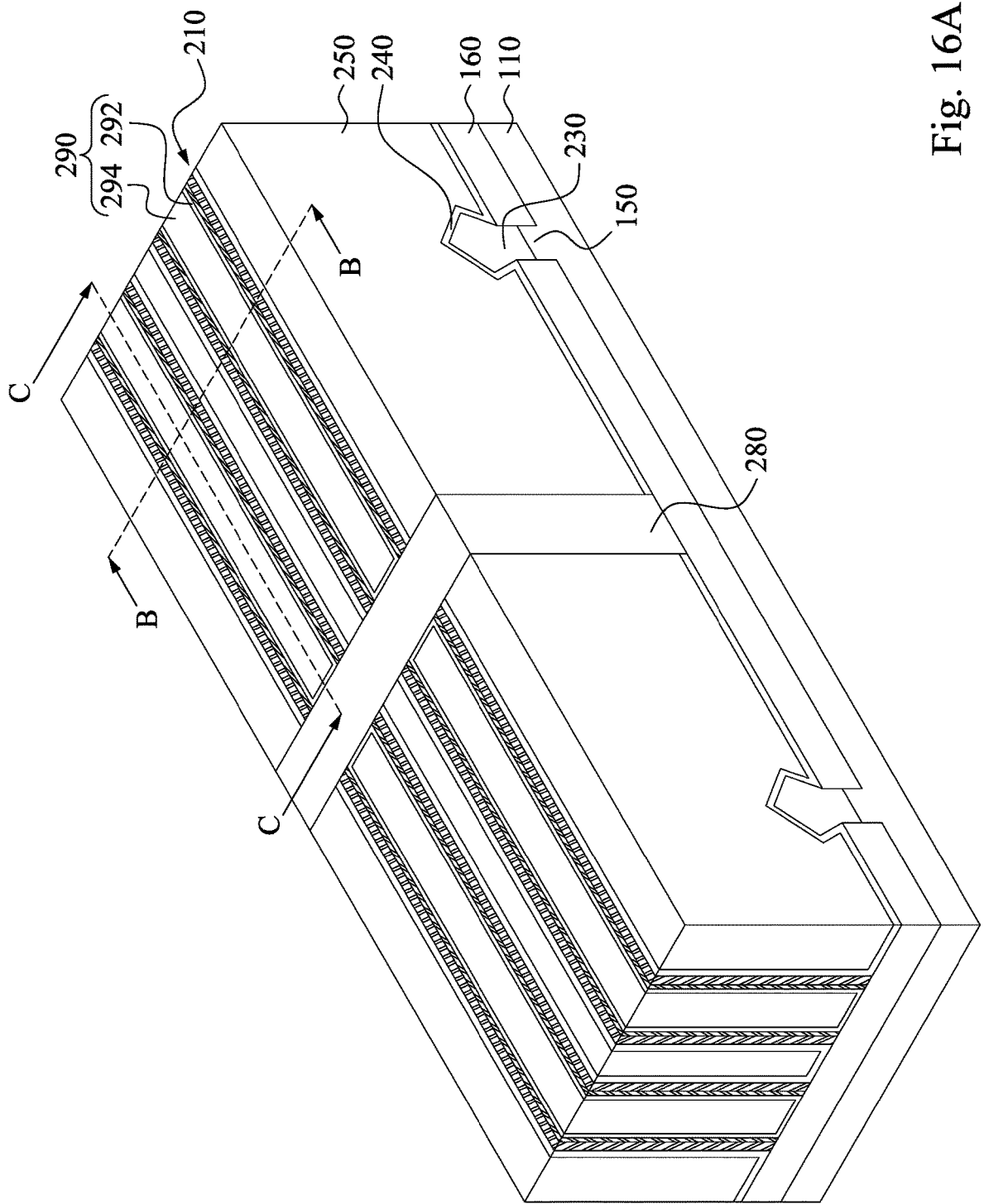
Figure 16B:
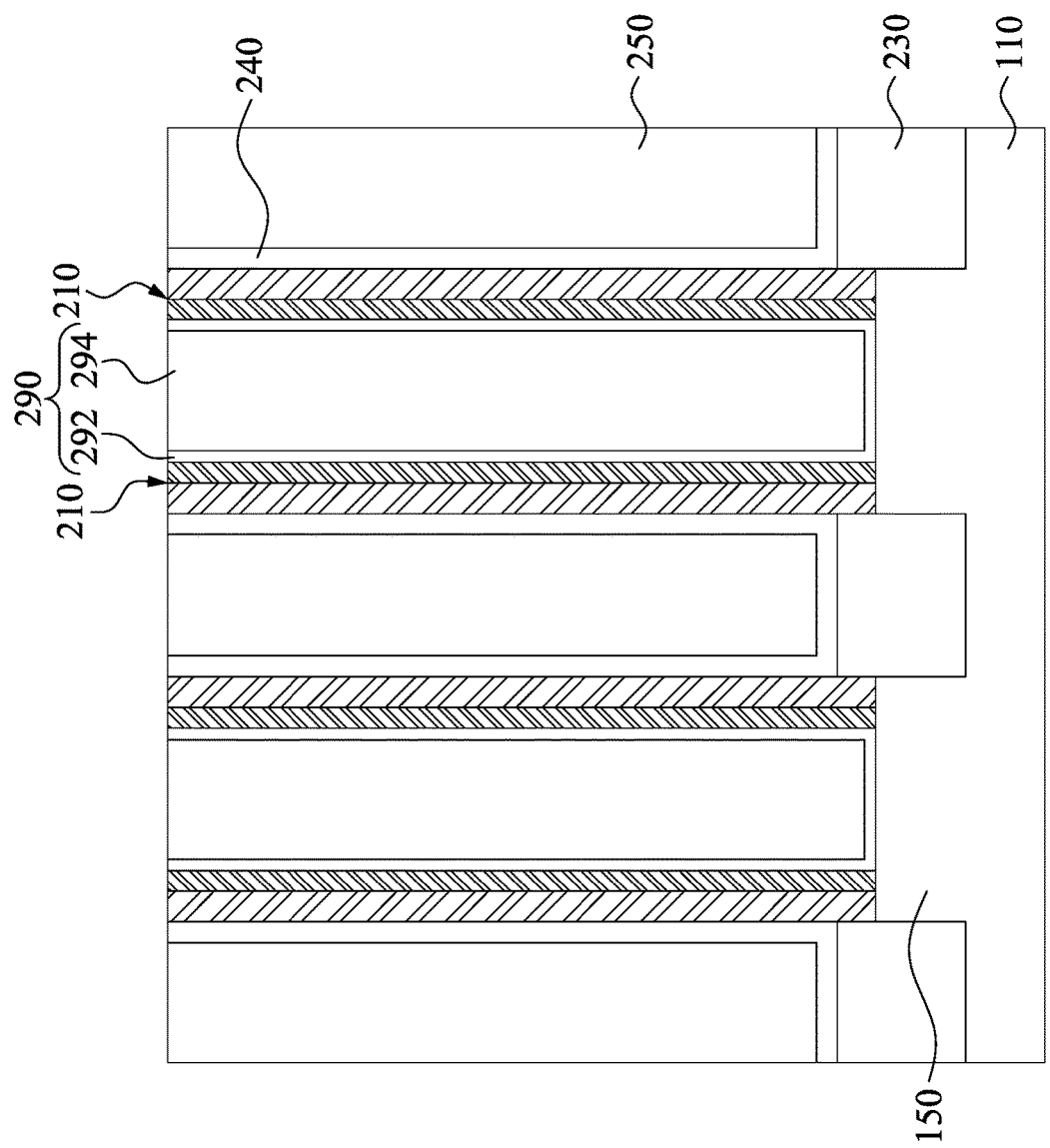
Figure 16C:
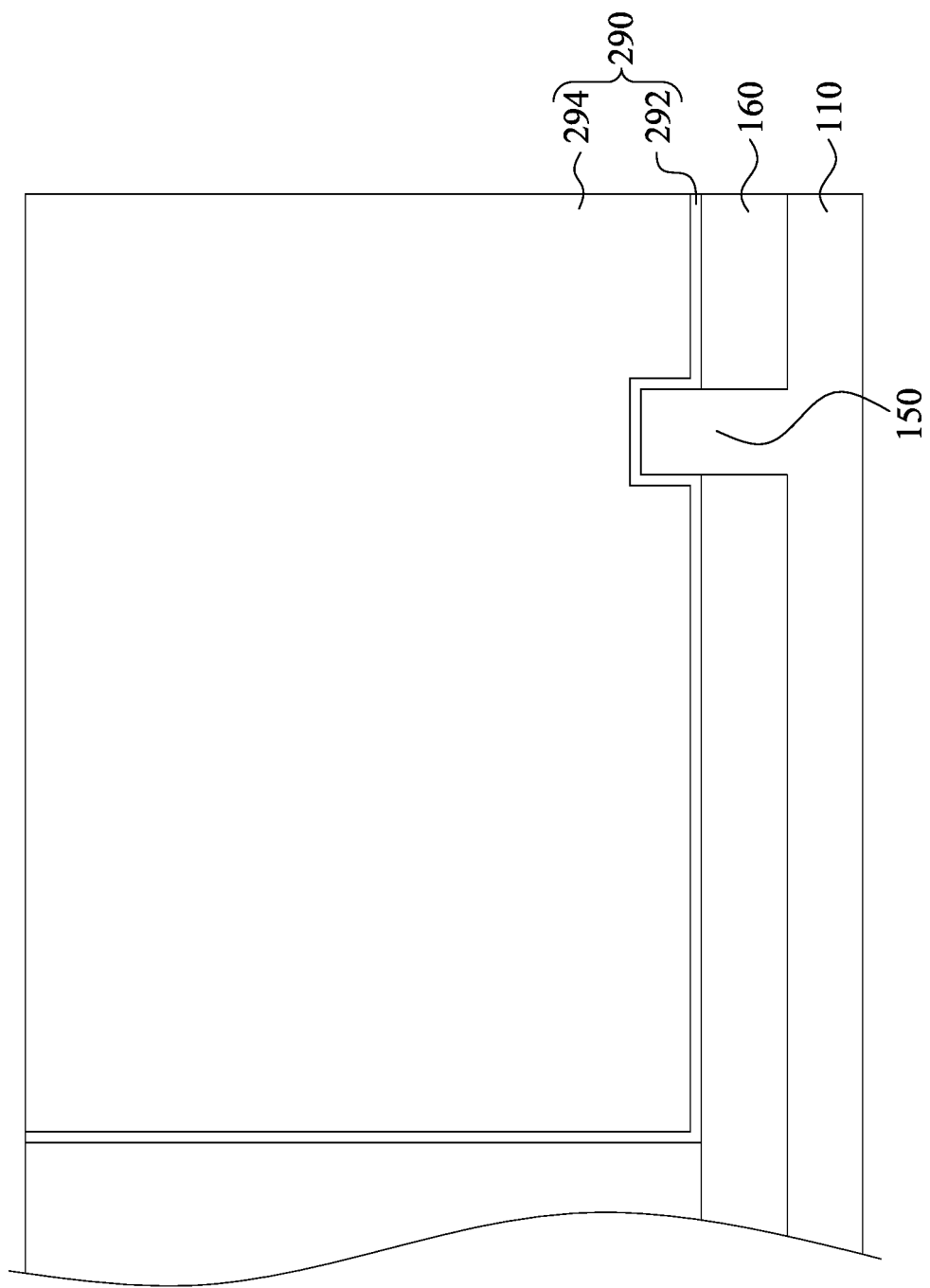

Reference is made to FIGS. 16A, 16B, and 16C, in which FIG. 16B is a cross-sectional view along line B-B of FIG. 16A, and FIG. 16C is a cross-sectional view along line C-C of FIG. 16A. A plurality of gate stacks 290 are formed in the openings O2, respectively. That is, in some embodiments using a gate-last process, the dummy gate structures 200 is replaced by the final gate stack 290 at a subsequent step. In some embodiments, the dummy gate structures 200 may be replaced at a later step by a high-k dielectric layer and a metal gate electrode. A plurality of layers included in the gate stacks 290 may be sequentially deposited in the openings O2. Then, a CMP process is performed to remove excessive materials to form the gate stack 290.

In some embodiments represented in FIGS. 16A to 16C, each of the gate stacks 290 includes a gate dielectric layer 292 and a gate metal 294, which can be formed by suitable process. The gate dielectric layer 292 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, SiO, LaSiO, AlSiO, HfTaO, HfFiO, $(Ba,Sr)TiO_3$ (BST), $Al_2O_3$, $Si_3N_4$, oxynitrides (SiON), combinations thereof, or other suitable material.

The gate metals 294 may include work function metal layer(s) and gate electrode. In some embodiments, work function metal layer may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The gate electrode may include tungsten (W). In some other embodiments, the gate electrode includes aluminum (Al), copper (Cu) or other suitable conductive material.

Figure 17A:
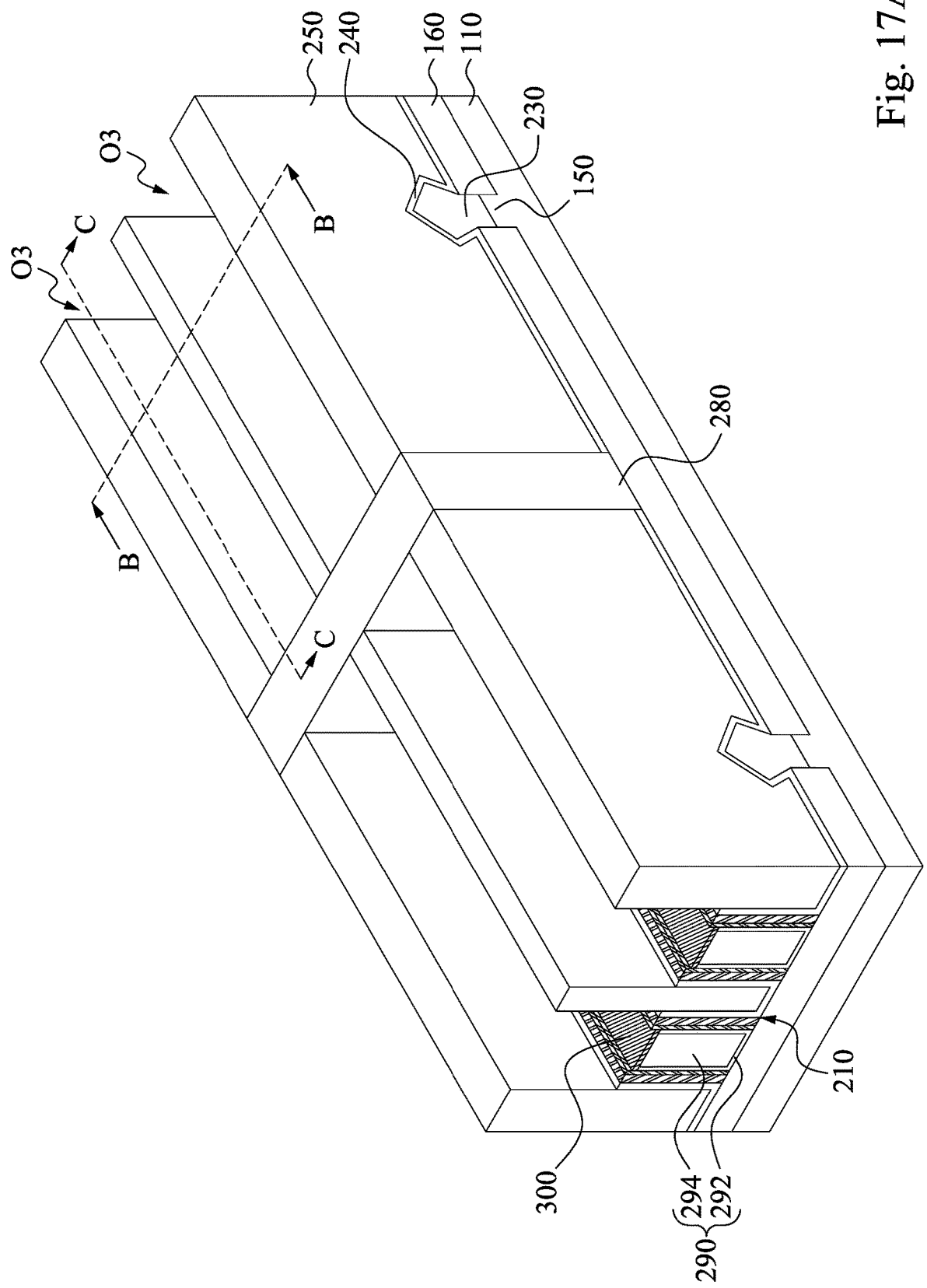
Figure 17B:
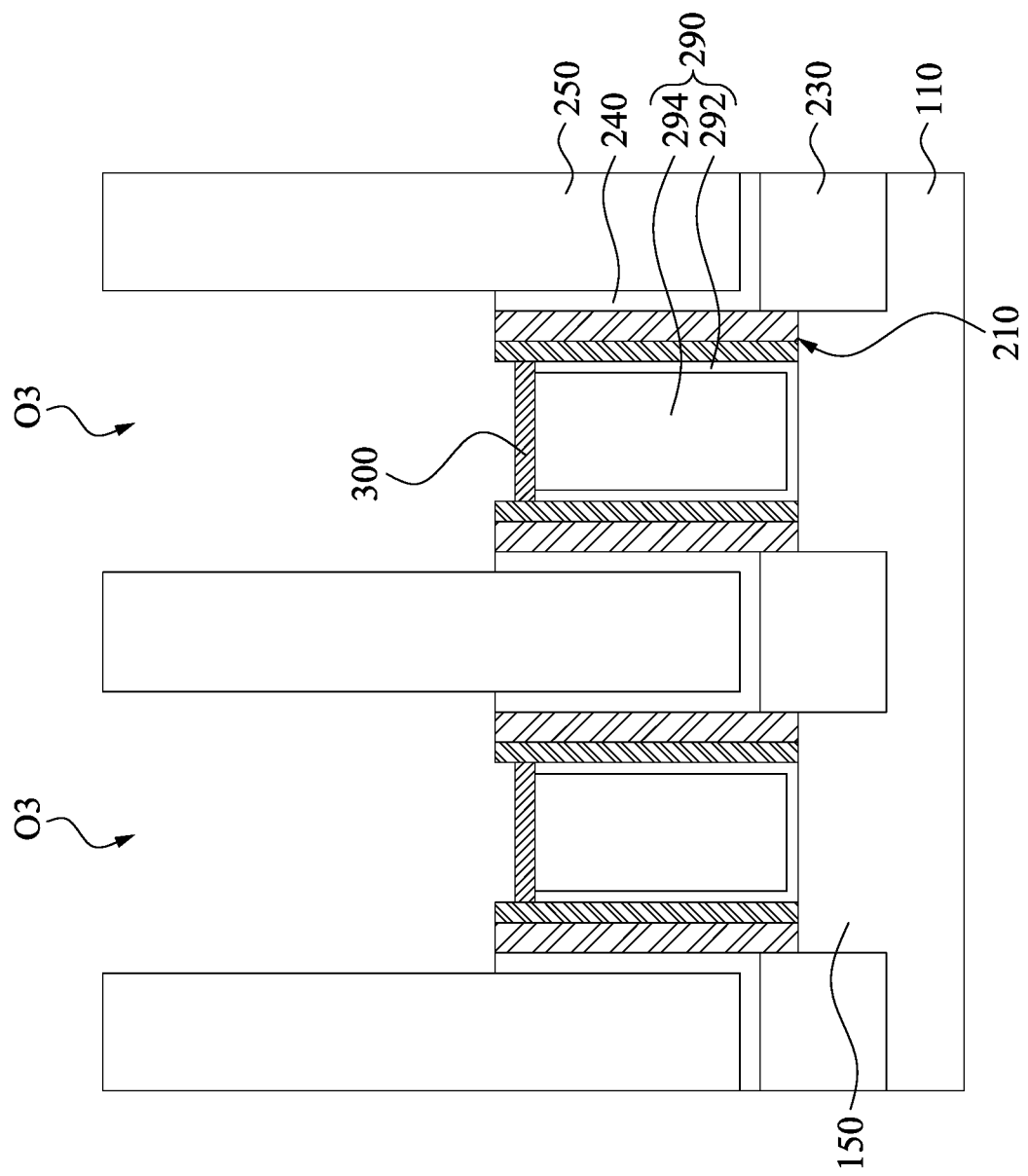
Figure 17C:
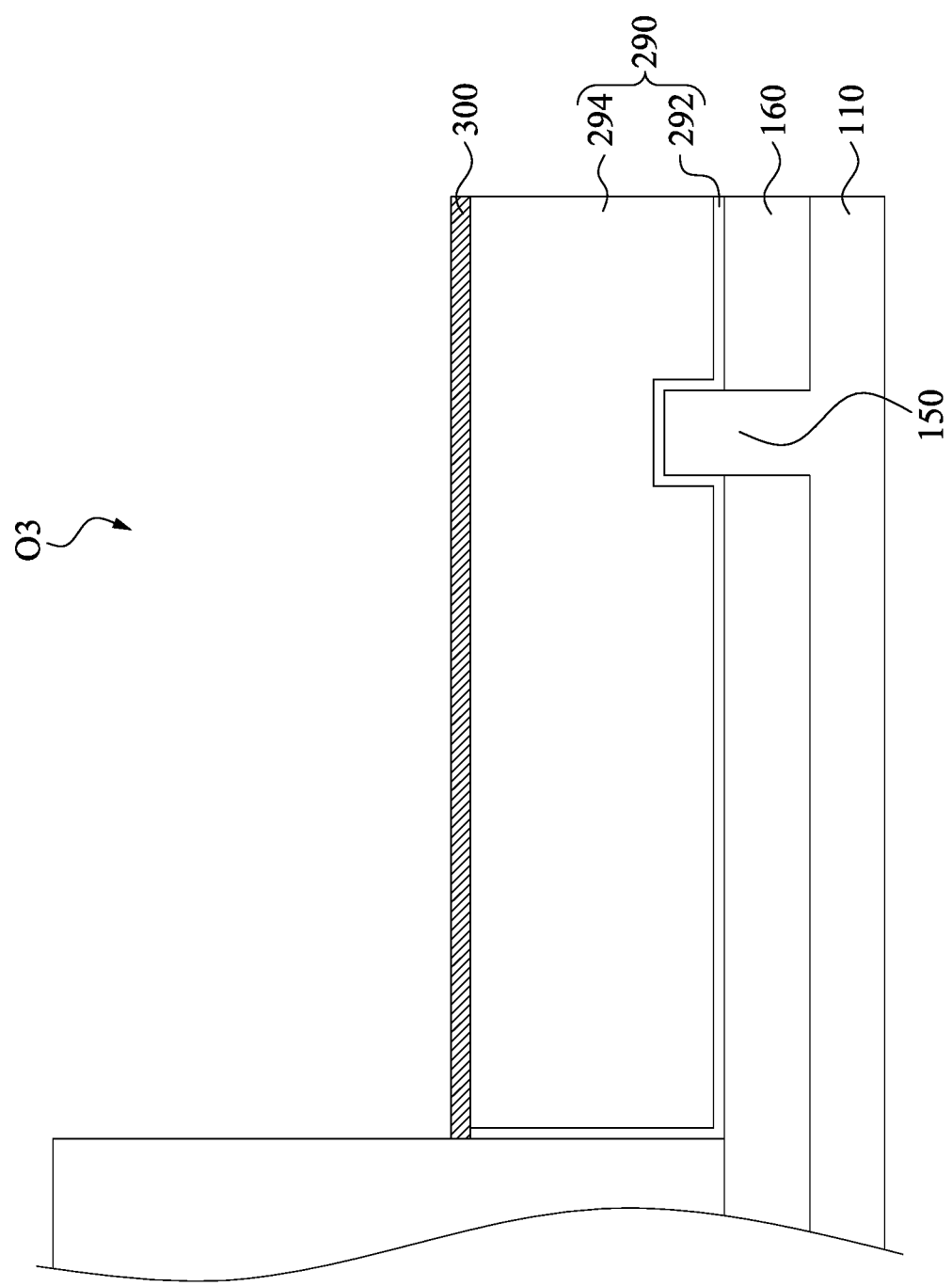

Reference is made to FIGS. 17A, 17B, and 17C, in which FIG. 17B is a cross-sectional view along line B-B of FIG. 17A, and FIG. 17C is a cross-sectional view along line C-C of FIG. 17A. An etching back process is performed to remove portions of the gate stacks 290, the gate spacers 210, and the CESL 240. As a result, openings O3 are formed in the interlayer dielectric 250. In some embodiments, the etching back process may include one or more etching processes. In some embodiments, because the materials of the gate stacks 290, the gate spacers 210, and the CESL 240 have etching selectivity, an etching process may be initially performed to remove the gate stacks 290 to lower the top surface of the gate stacks 290. Then, another etching process is then performed to lower the gate spacers 210 and the CESL 240. Accordingly, the top surfaces of the gate stacks 290 may be at a different level from the top surfaces of the gate spacers 210 and the CESL 240. For example, in FIGS. 17A and 17B, the top surface of the gate stacks 290 is at a level lower than the top surfaces of the gate spacers 210 and the CESL 240.

Then, a plurality of etching barrier layers 300 are formed respectively on the top surface of the gate stacks 290 by suitable process, such as CVD or ALD. In some embodiments, the etching barrier layers 300 are formed on the gate stacks 290 via a bottom-up approach. That is, the etching barrier layers 300 are selectively grown on the metal surface, such as the gate electrode 294, and thus the sidewalls of the gate spaces 210 and the interlayer dielectric 250 are substantially free from the growth of the etching barrier layers 300. In some embodiments, the etching barrier layers 300 may be a metal layer including but not limited to, for example, tungsten (W). In some embodiments, portions of the etching barrier layers 300 may overflow over the gate dielectrics 292, such that the etching barrier layers 300 may also cover the exposed surface of the gate dielectrics 292. Since the etching barrier layers 300 are formed in a bottom-up manner, the formation thereof may be simplified by, for example, reducing repeated etching processes which are used to remove unwanted metal layers on sidewalls of the gate trench associated with conformal growth. In some embodiments, the etching barrier layers 300 can also be referred to as conductive layer or metal layer.

In a bottom-up approach, the growth of the etching barrier layers 300 has a different nucleation delay on a metal-containing surface (i.e., the gate electrode 294) as compared to a dielectric surface (i.e., the gate spacers 210 and the interlayer dielectric 250). Usually, the nucleation delay on the metal-containing surface is shorter than on the dielectric surface. The nucleation delay differences can be used to allow selective growth on the metal-containing surface. The present disclosure utilizes the selectivity to allow metal growth from a bottom of a trench (i.e. the gate electrode 294) while limiting the growth from the dielectric side walls (i.e. the gate spacers 210 and the interlayer dielectric 250). As a result, the deposition rate of the etching barrier layers 300 on the metal-containing surface (i.e., the gate electrode 294) is faster than that on the dielectric surface (i.e., the gate spacers 210 and the interlayer dielectric 250).

Figure 18A:
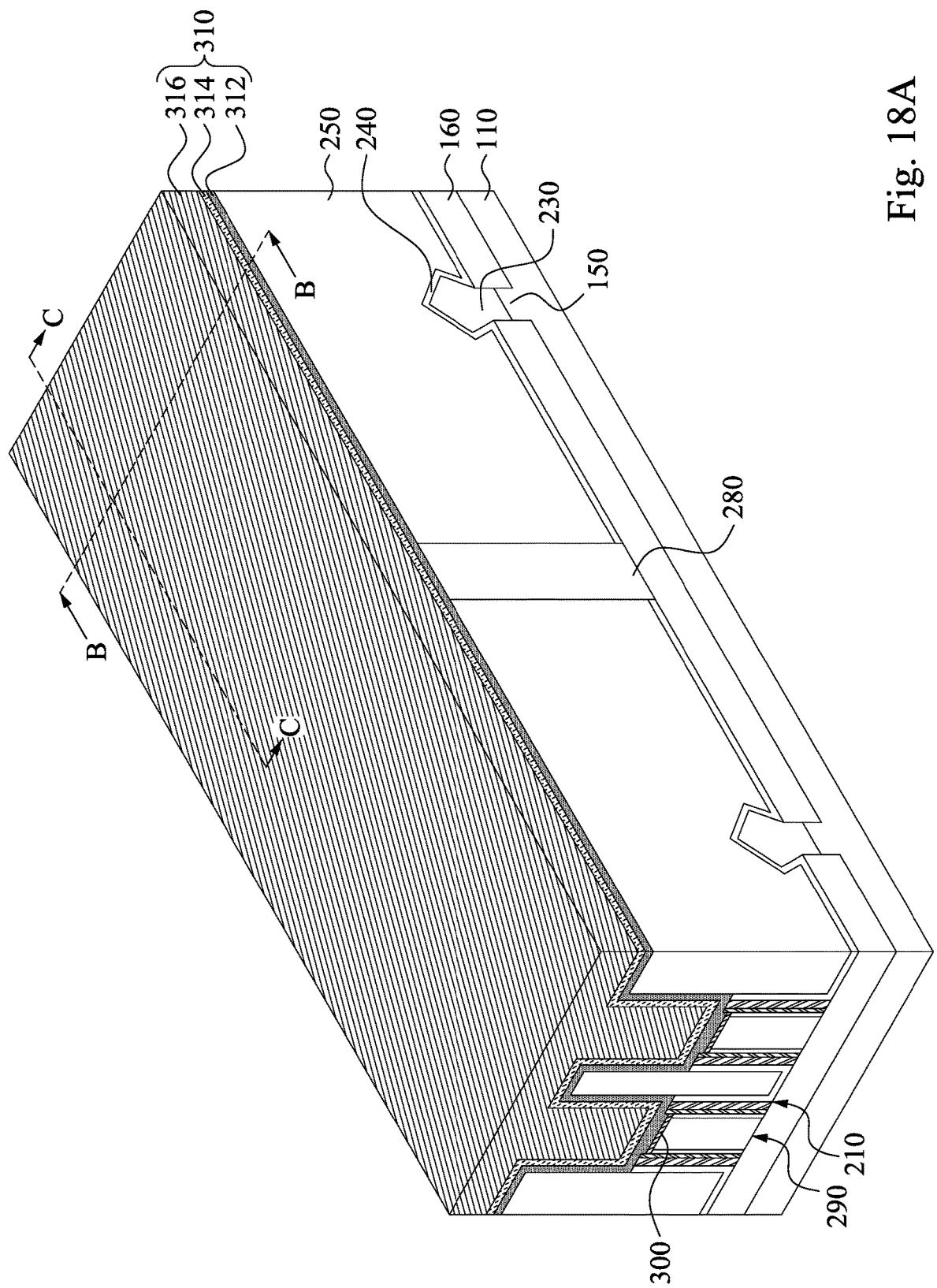
Figure 18B:
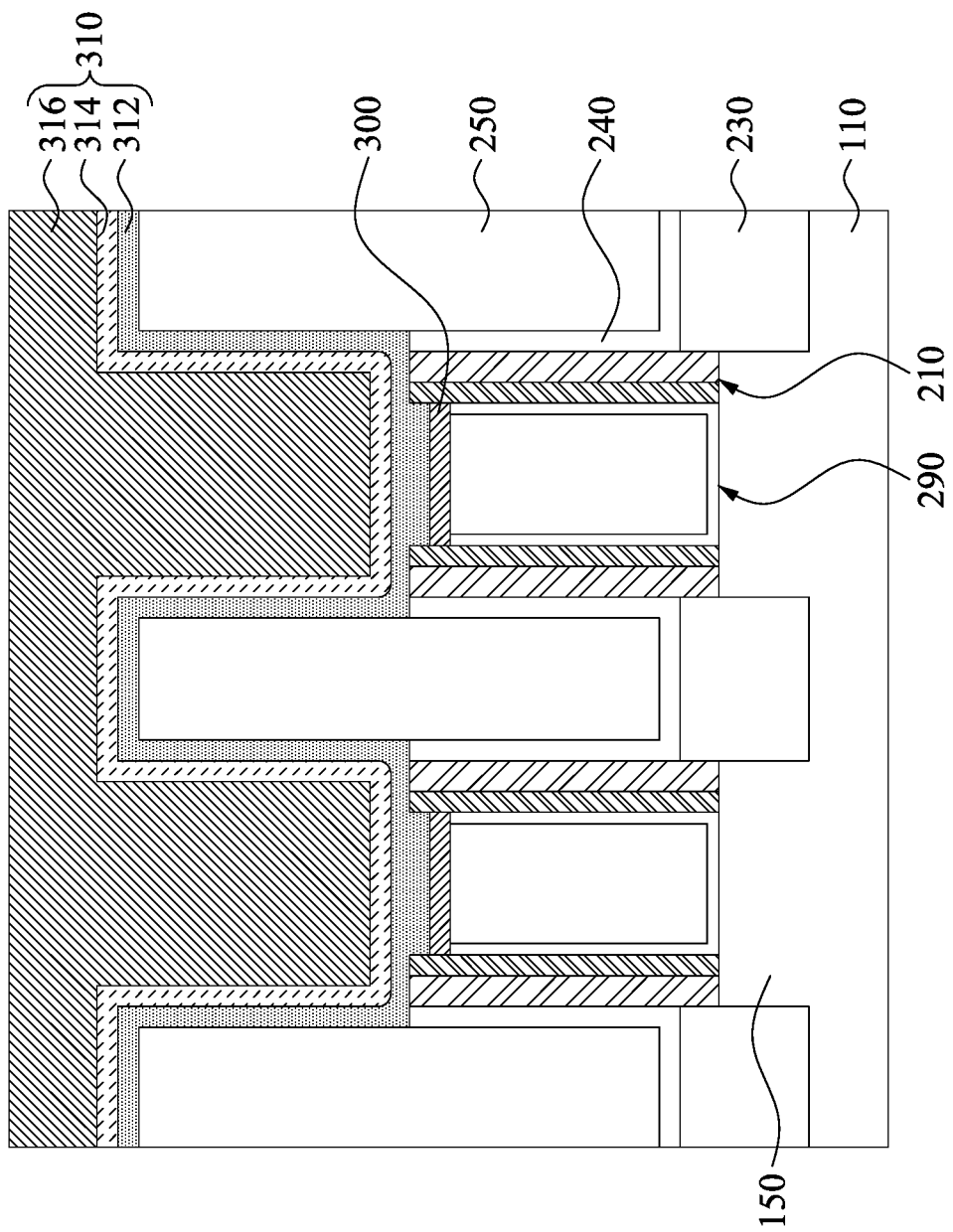
Figure 18C:
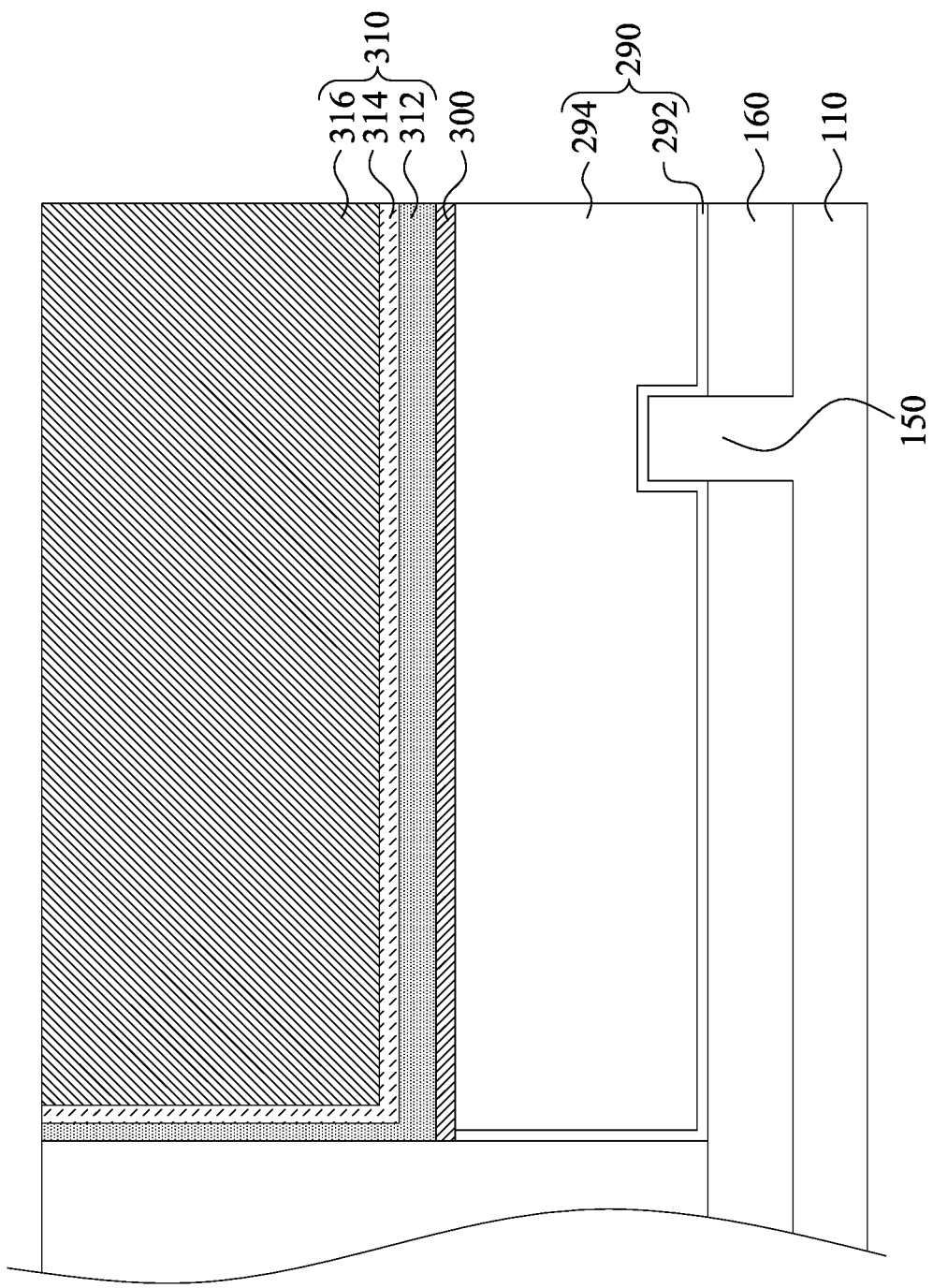

Reference is made to FIGS. 18A, 18B, and 18C, in which FIG. 18B is a cross-sectional view along line B-B of FIG. 18A, and FIG. 18C is a cross-sectional view along line C-C of FIG. 18A. A first insulating layer 312, a sacrificial layer 314, and a second insulating layer 316 are formed sequentially in the openings O3 by suitable deposition process, such as PVD, CVD, and ALD. In some embodiments, the first insulating layer 312 and the second insulating layer 316 may be oxide, nitride, oxynitride, or combination thereof. For example, the first insulating layer 312 and the second insulating layer 316 may include $HfO_2$, $ZrO_2$, and $Al_2O_3$. For example, the first insulating layer 312 and the second insulating layer 316 may include $ZrO_2$ to provide etching selectivity to the gate spaces 210 including SiN. In some embodiments, the first insulating layer 312 and the second insulating layer 316 can be made of the same material. In some embodiments, the sacrificial layer 314 may include amorphous silicon (a-Si). In some embodiments, the sacrificial layer 314 may include sufficient etching selectivity with respect to the first insulating layer 312 and the second insulating layer 316, so as to facilitate the etching process performed in later step (e.g., the etching process in FIGS. 24A to 24D). In some embodiments, the thickness of the sacrificial layer 314 is in a range from about 1 nm to about 3 nm. For example, the sacrificial layer 314 is about 2 nm.

Figure 19A:
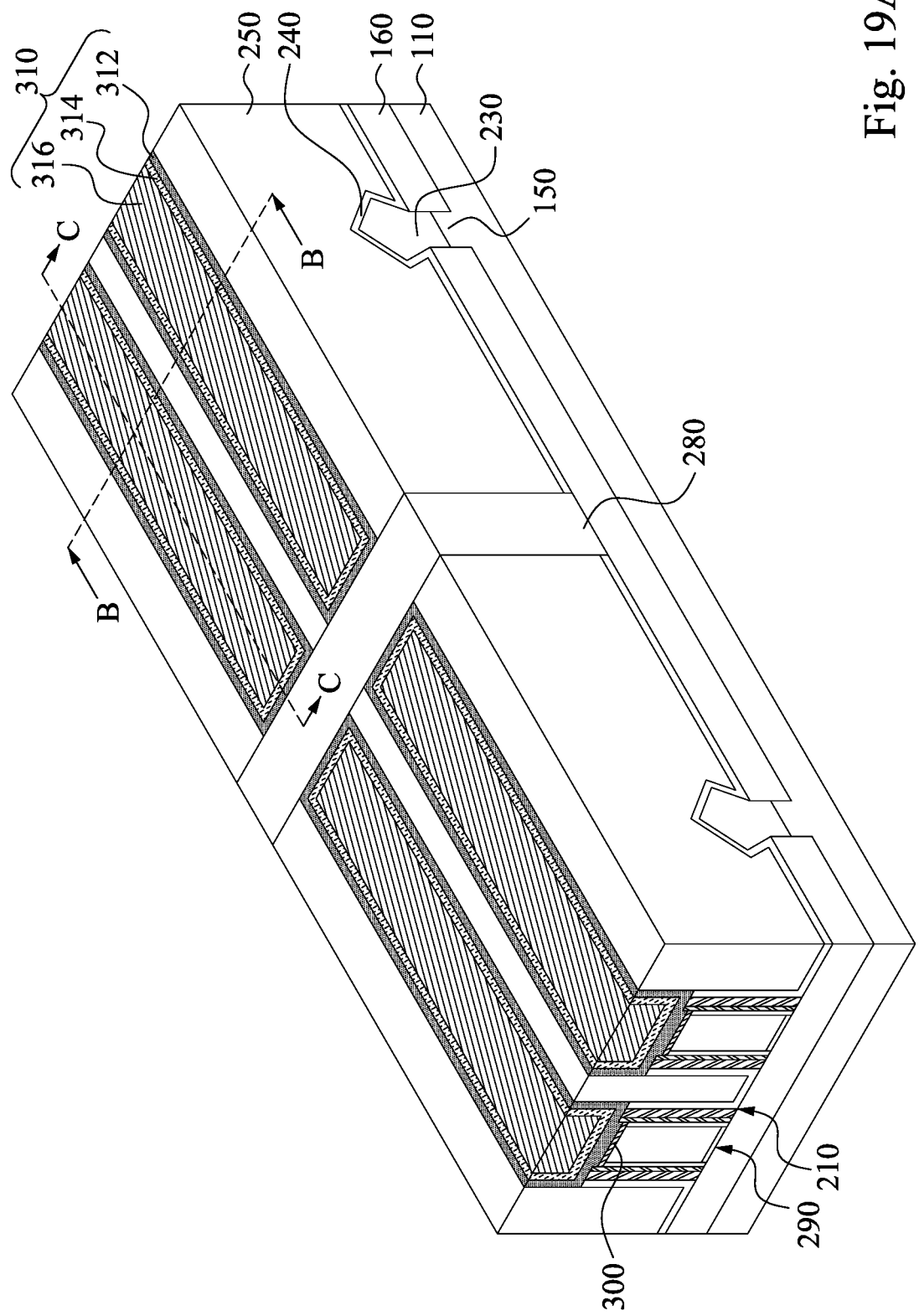
Figure 19B:
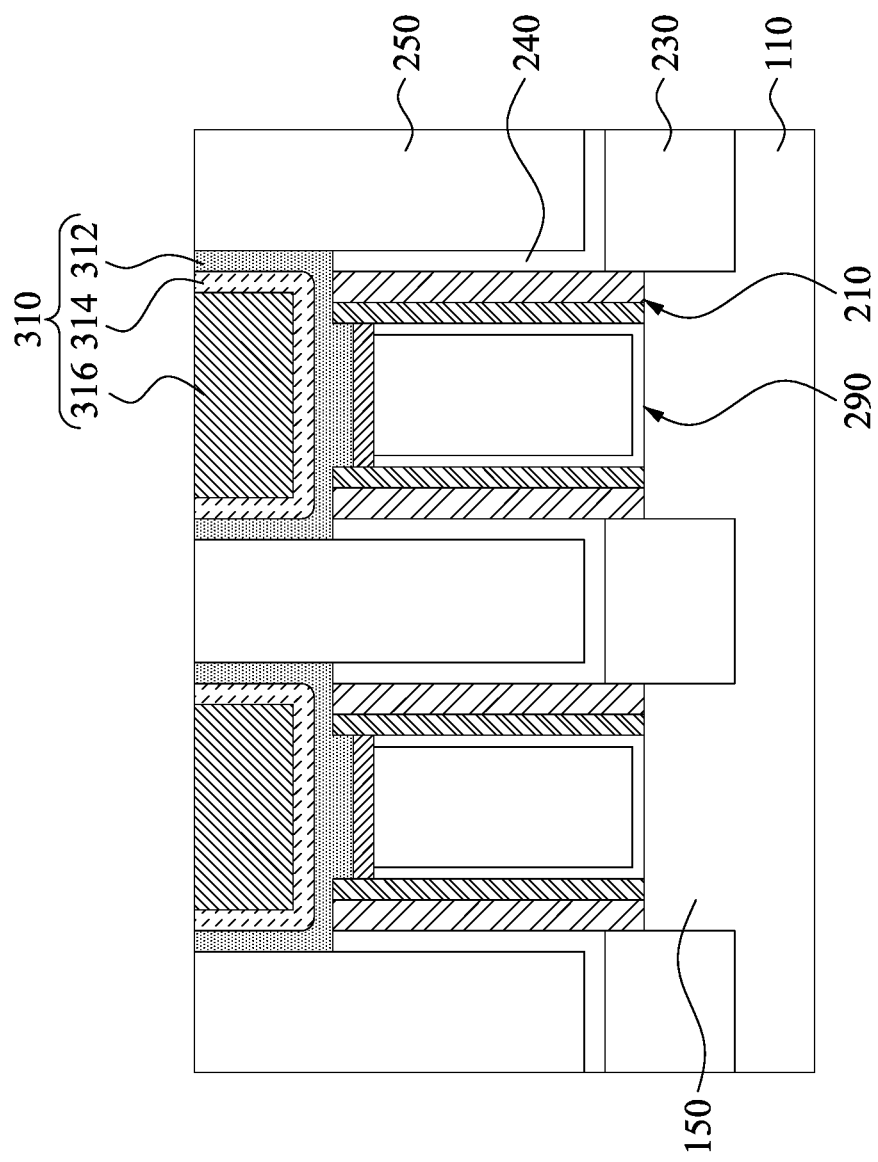
Figure 19C:
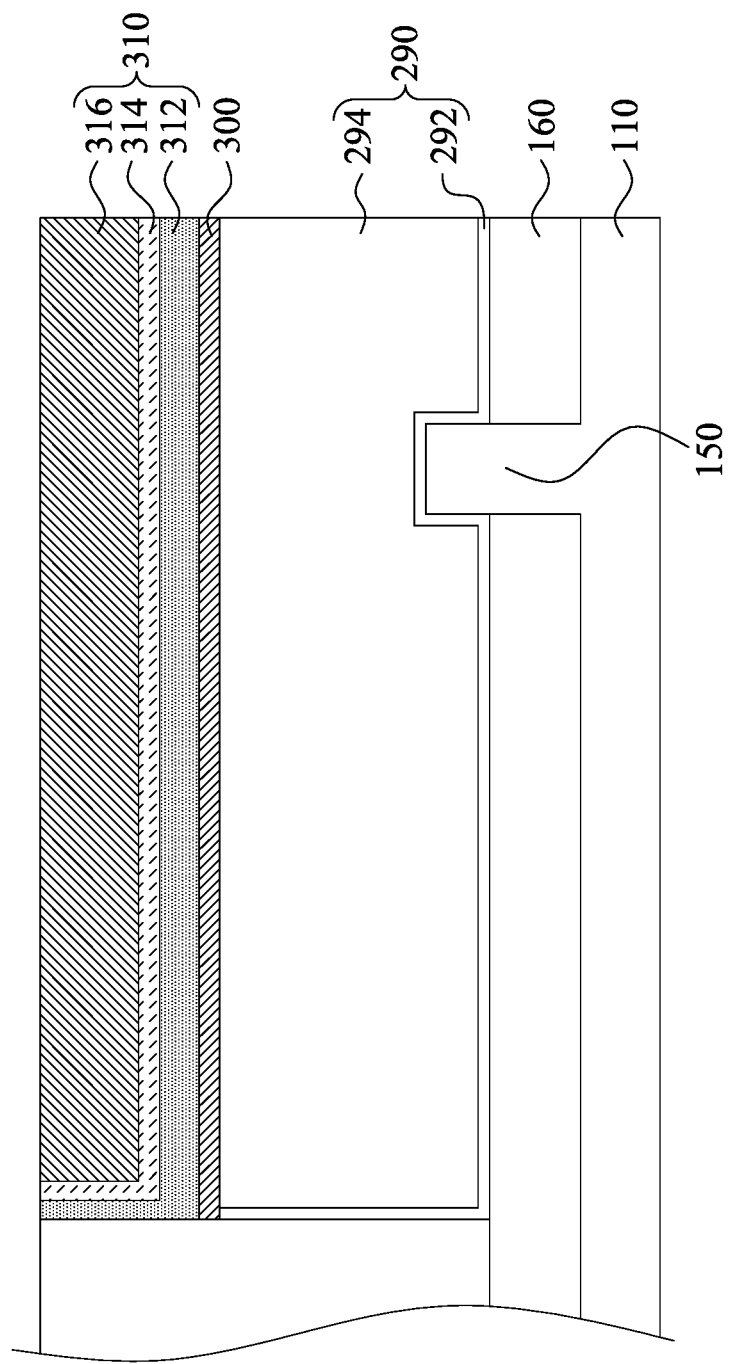

Reference is made to FIGS. 19A and 19B, in which FIG. 19B is a cross-sectional view along line B-B of FIG. 19A, and FIG. 19C is a cross-sectional view along line C-C of FIG. 19A. A planarization process, such as CMP, is performed to remove excessive materials of the first insulating layer 312, the sacrificial layer 314, and the second insulating layer 316 until the interlayer dielectric 250 is exposed. After the planarization process, the remaining first insulating layer 312, the sacrificial layer 314, and the second insulating layer 316 can be collectively referred to as self-aligned insulating structure 310, because the first insulating layer 312, the sacrificial layer 314, and the second insulating layer 316 is formed aligned with the openings O3 in FIGS. 17A to 17C. In some embodiments, since the gate stack 290 has a top surface lower than a top surface of the gate spacers 210, a portion of the self-aligned insulating structure 310 is formed between the gate spacers 210. That is, the self-aligned insulating structure 310 is in contact with the top surfaces of the gate spacers 210 and the sidewalls of the gate spacers 210. Stated another way, the self-aligned insulating structure 310 has a stepped bottom surface.

Referring back to FIGS. 17A to 17C, during the etching back process of FIGS. 17A to 17C, the gate spacers 210 and the CESL 240 are partially removed. The width of the openings O3 is greater than the width of the gate stacks 290. As a result, the self-aligned insulating structure 310 in FIGS. 19A and 19B, which is self-aligned to the openings O3 in FIGS. 17A and 17B, may also include a width greater than the width of the gate stacks 290, such that the self-aligned insulating structure 310 is in contact with top surfaces of the gate spacers 210 and the top surface of the CESL 240. This will facilitate the formation of air slit in later process (e.g., the formation of the air slit AS in FIGS. 24A to 24D).

Figure 20A:
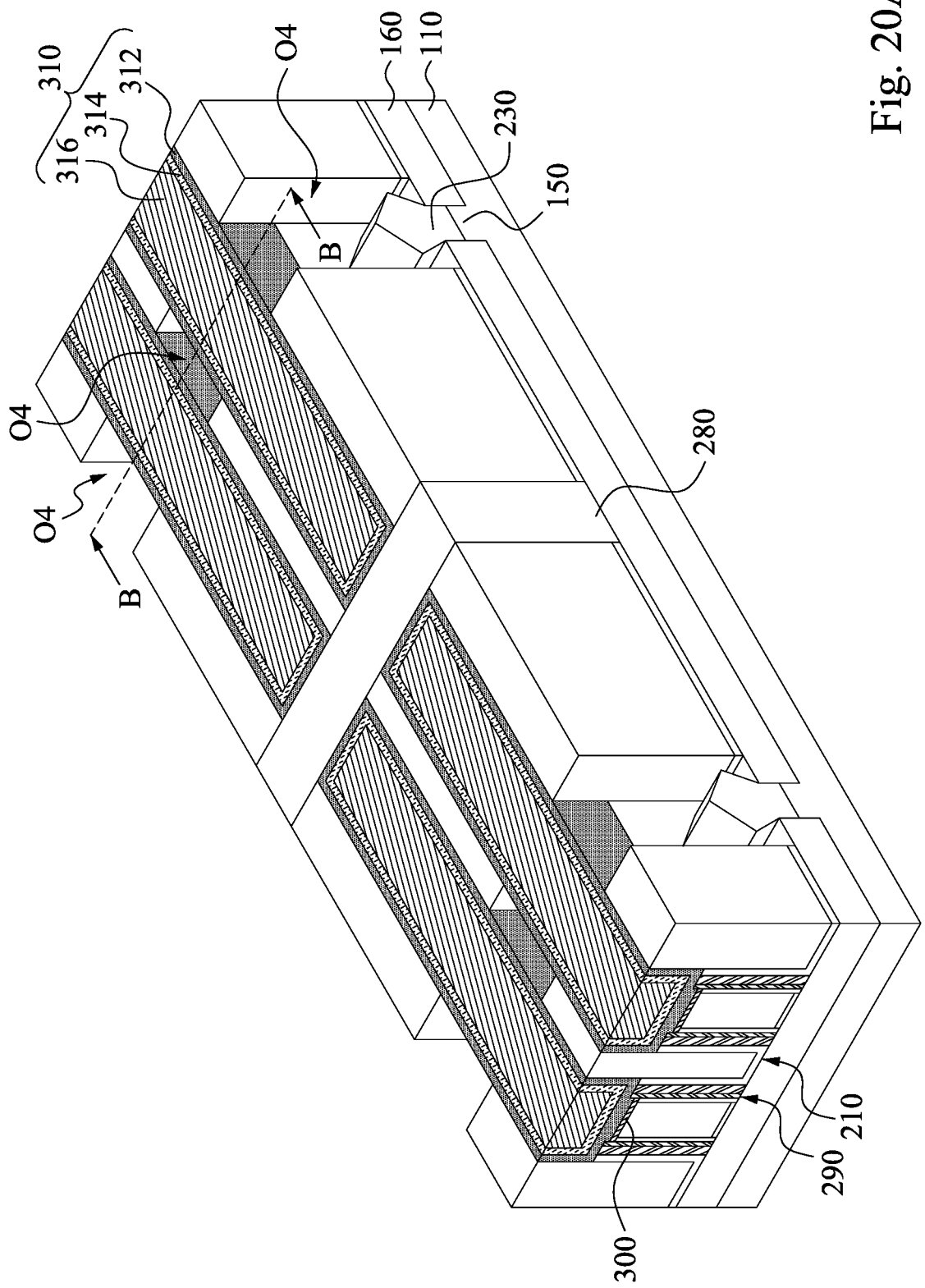
Figure 20B:
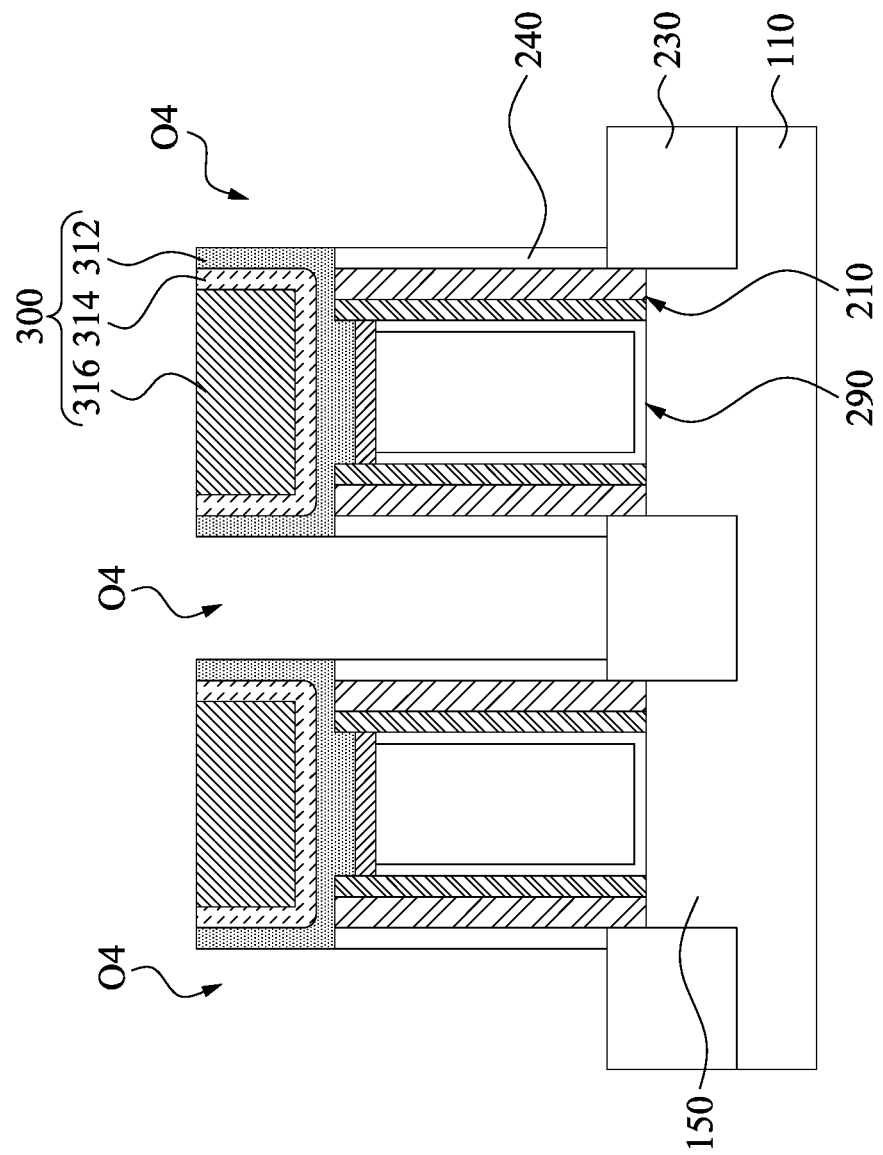

Reference is made to FIGS. 20A and 20B, in which FIG. 20B is a cross-sectional view along line B-B of FIG. 20A. An etching process is performed to remove a portion of the interlayer dielectric 250 and the CESL 240 to form openings O4, so as to expose the underlying source/drain structures 230. In some embodiments, a patterned mask may be initially formed over the substrate 110 that defines the desired positions of the openings O4. Then, the etching process, including dry etch, wet etch, or combination thereof, may be performed to remove the interlayer dielectric 250 through the patterned mask to form the openings O4. After the openings O4 are formed, the patterned mask may be removed.

Figure 21A:
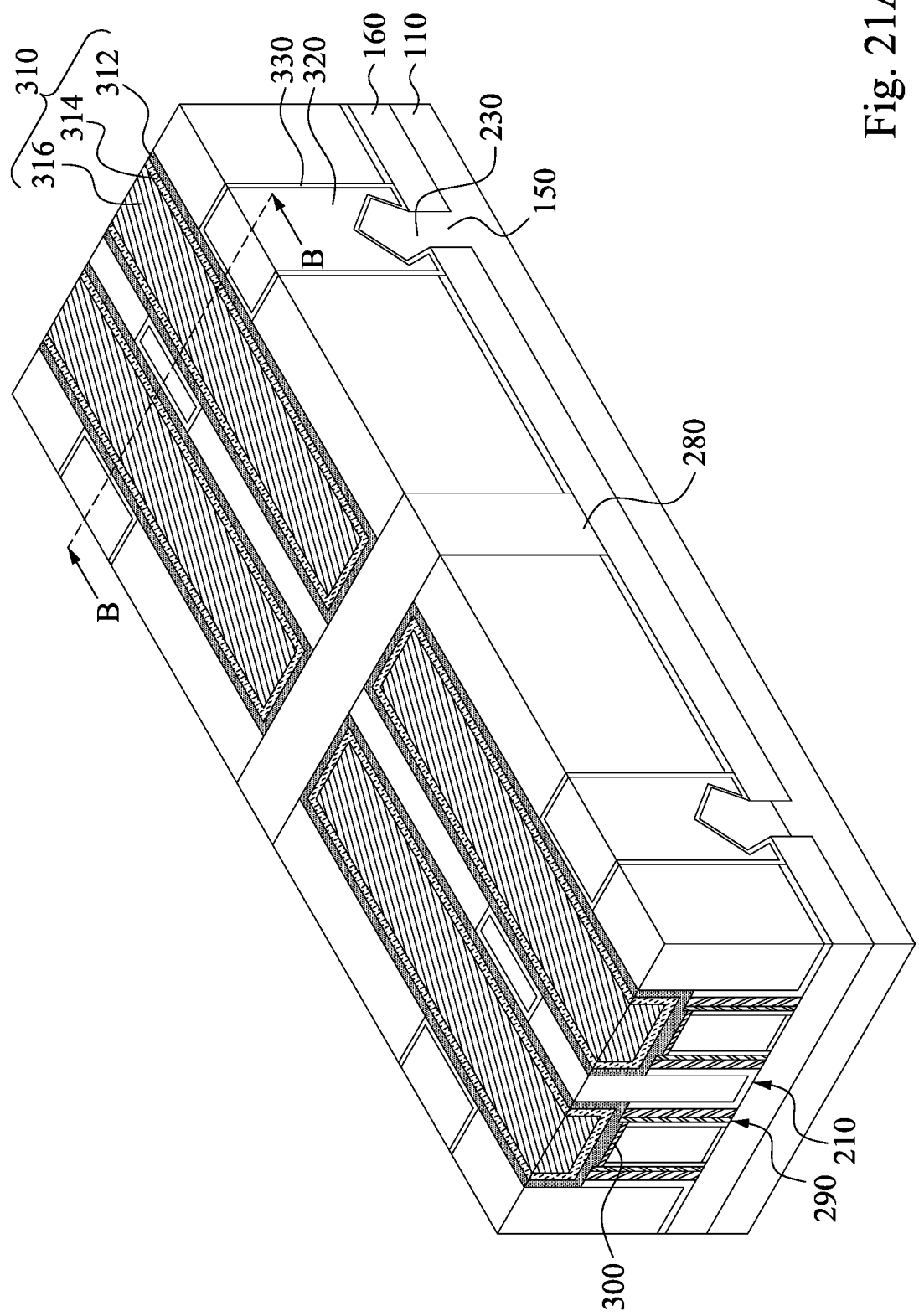
Figure 21B:
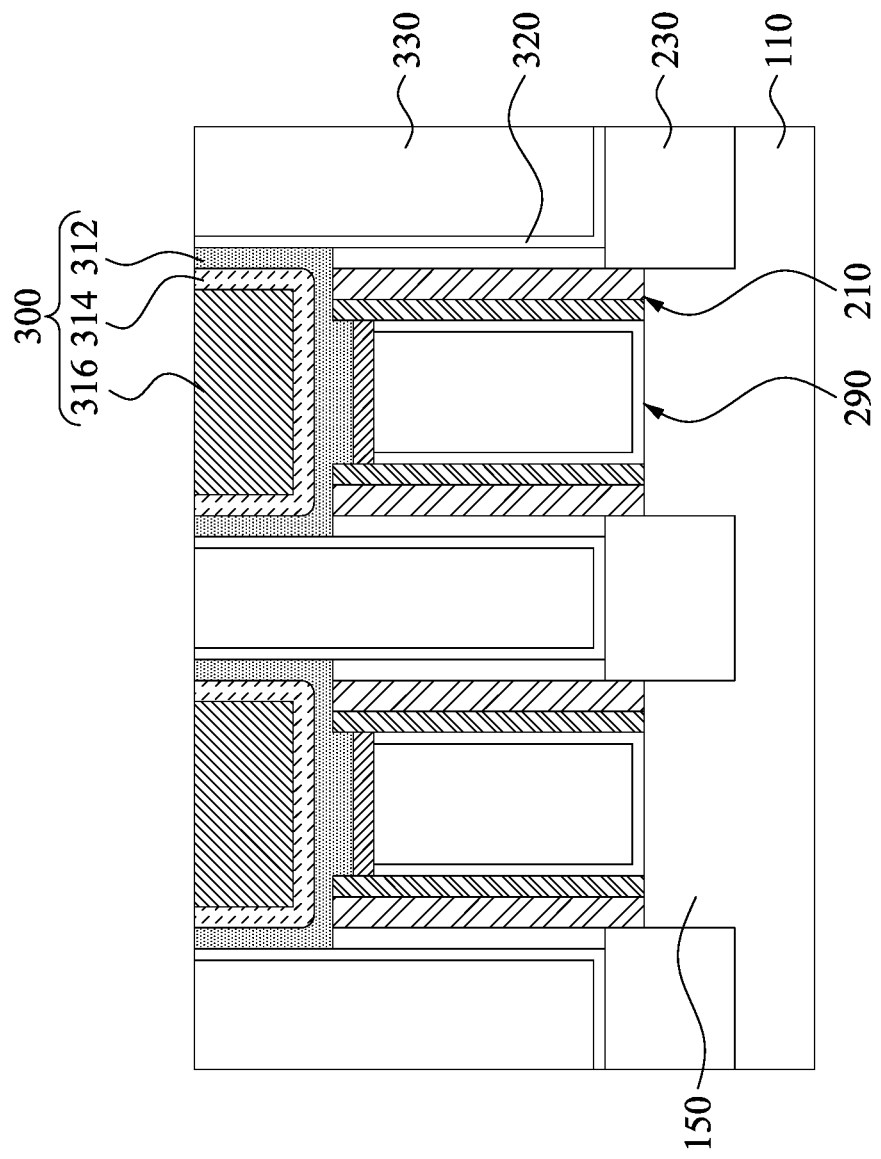

Reference is made to FIGS. 21A and 21B, in which FIG. 21B is a cross-sectional view along line B-B of FIG. 21A. A diffusion barrier layer 320 and a conductive material 330 are formed in the openings O4. In some embodiments, the diffusion barrier layer 320 is formed through a blanket formation that covers the sidewalls and bottoms of openings O4 over the source/drain structures 230. The diffusion barrier layer 320 may be formed of a material including titanium, titanium nitride, tantalum, tantalum nitride, ruthenium, ruthenium nitride, titanium compound, tantalum compound, or combinations thereof. The formation methods include physical vapor deposition (PVD), atomic layer deposition (ALD), and other commonly used methods. Then, a seed layer (not shown), which may include copper or copper alloys, is formed over the diffusion barrier layer 320. A conductive material 330 is then filled into openings O4, by using suitable process, such as plating. The conductive material 330 may include copper or copper alloys, although other materials such as aluminum, tungsten, silver, or combinations thereof, can also be used. Then, a planarization process, such as CMP, may be performed to remove excessive diffusion barrier layer 320 and conductive material 330 until the self-aligned insulating structures 310 are exposed. In some embodiments, the diffusion barrier layer 320 and conductive material 330 may be collectively referred to as source/drain contact.

Figure 22A:
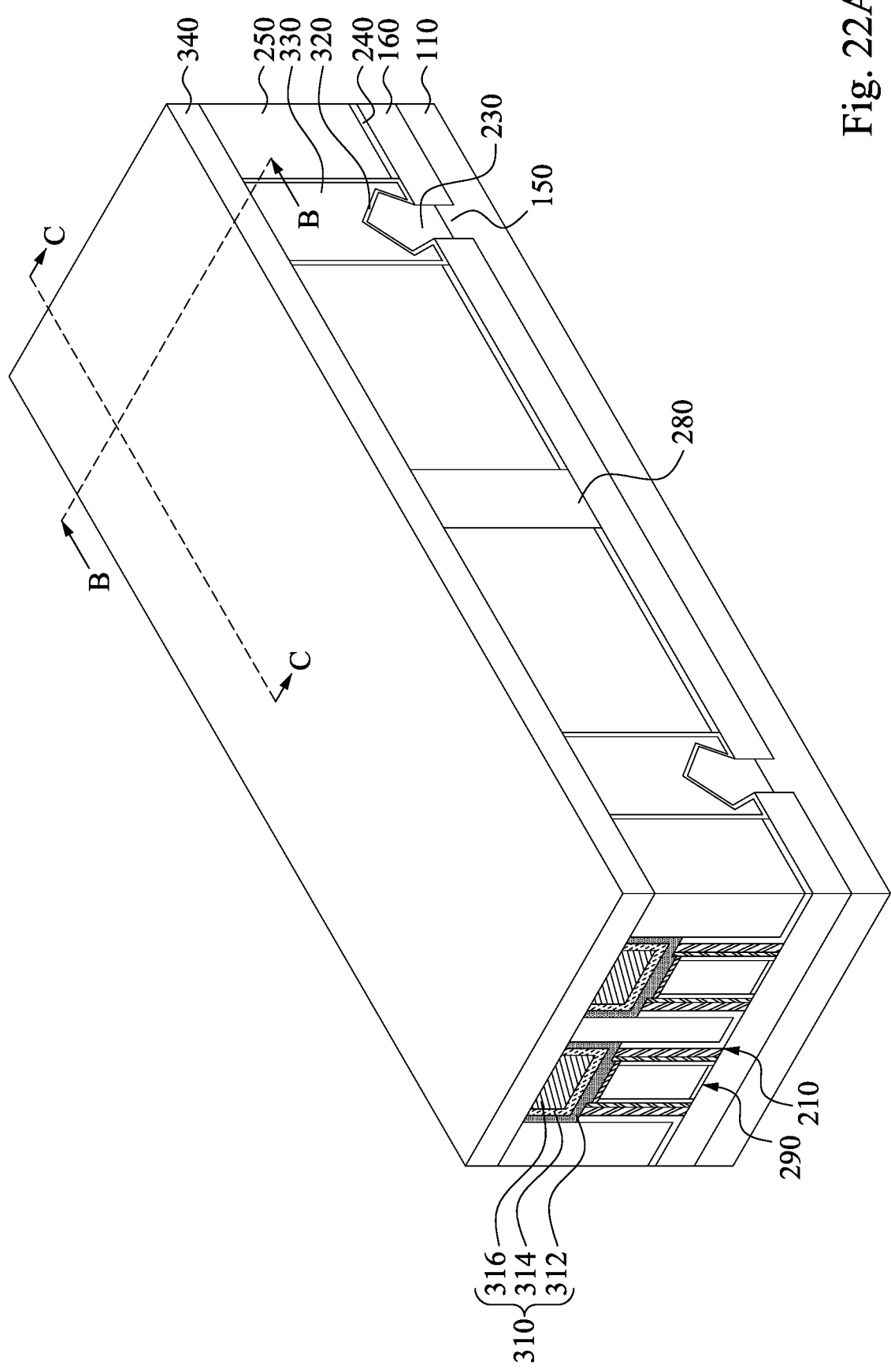
Figure 22B:
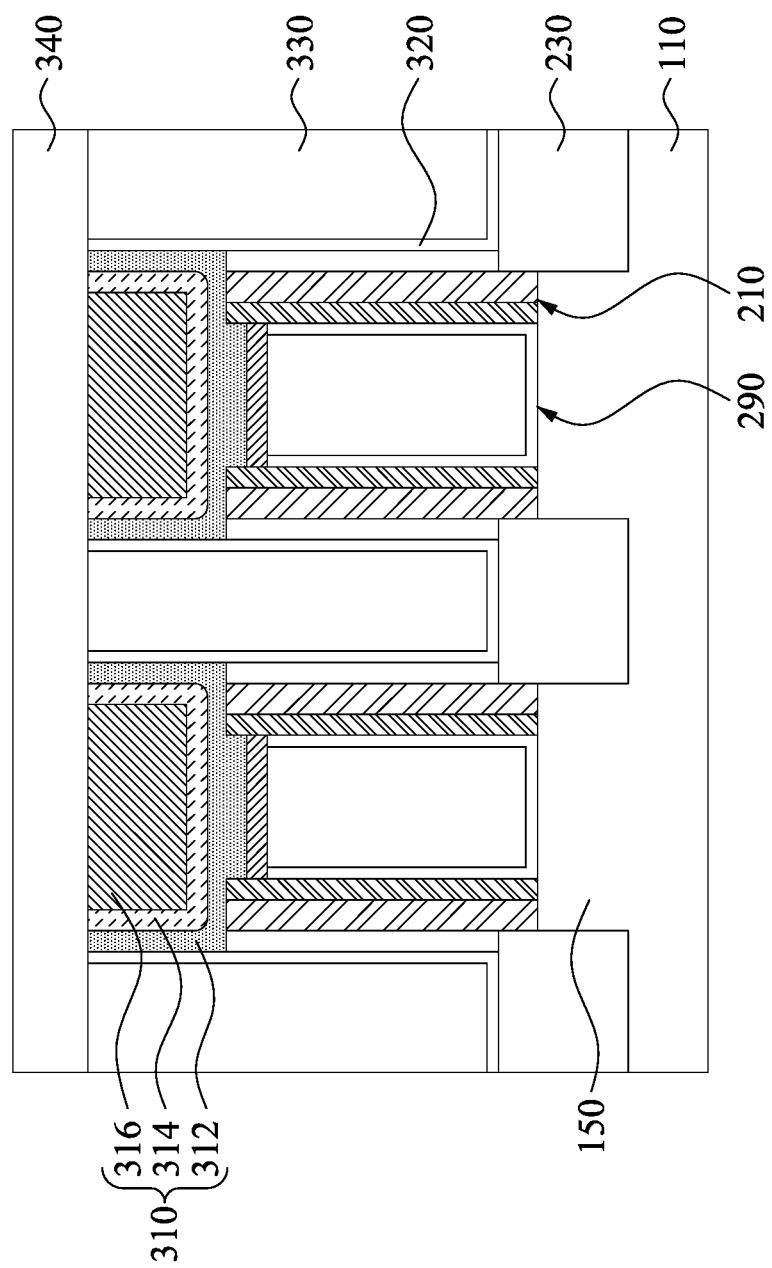
Figure 22C:
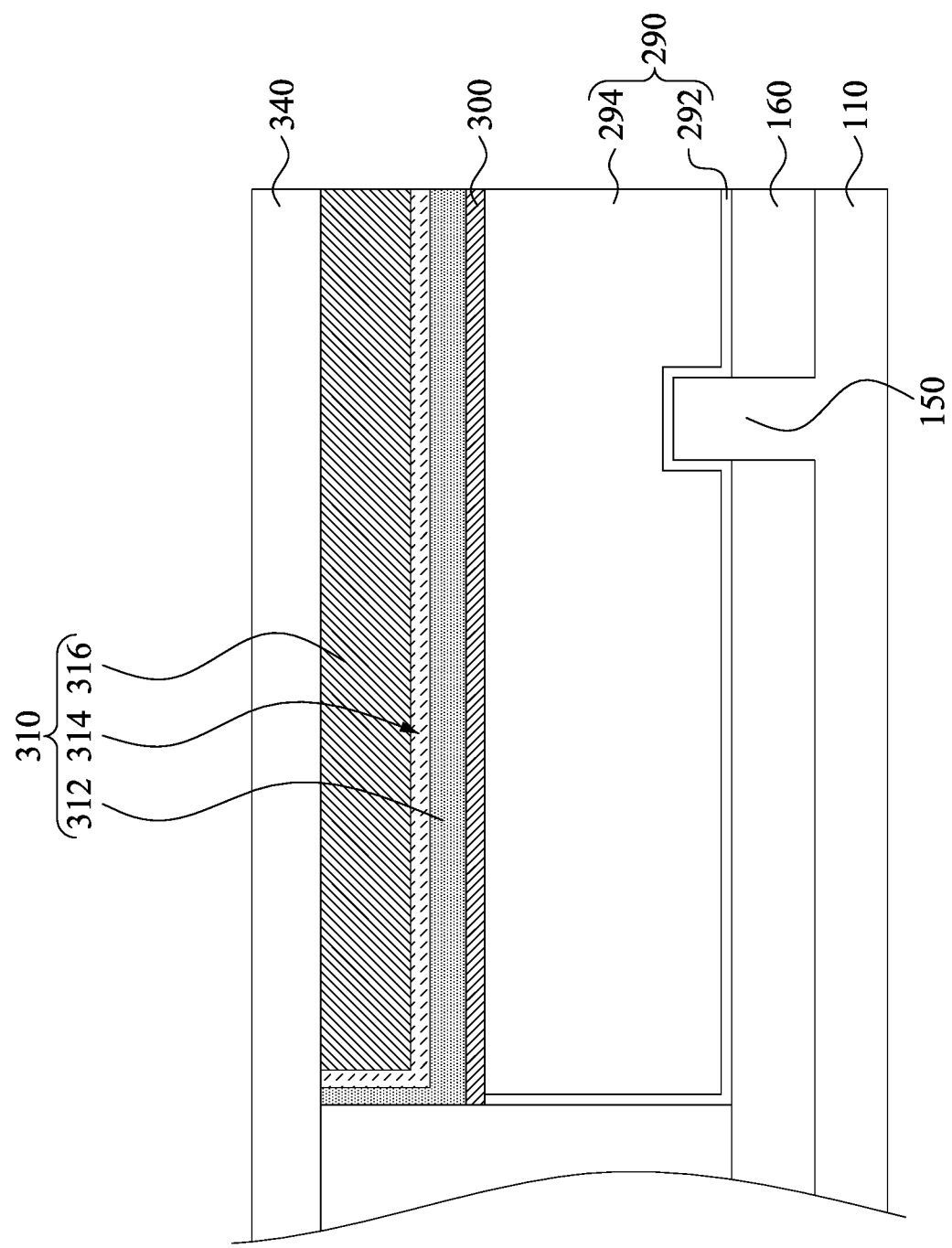

Reference is made to FIGS. 22A, 22B, and 22C, in which FIG. 22B is a cross-sectional view along line B-B of FIG. 22A, and FIG. 22C is a cross-sectional view along line C-C of FIG. 22A. A contact etching stop layer (CESL) 340 is formed over the substrate 110 and covers the interlayer dielectric 250, the self-aligned insulating structure 310, and the conductive material 330. In some embodiments, the CESL 340 is a dielectric layer including silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, and other low-k dielectric materials or low-k dielectric materials doped with one or more of carbon, nitrogen, and hydrogen and/or other suitable materials. In some embodiments, the CESL 340 is a middle contact etch stop layer (MCESL) made of silicon nitride, and the CESL 240 is a bottom contact etch stop layer (BCESL). The BCESL may compose of the same or different dielectric materials as those in the MCESL.

Figure 23A:
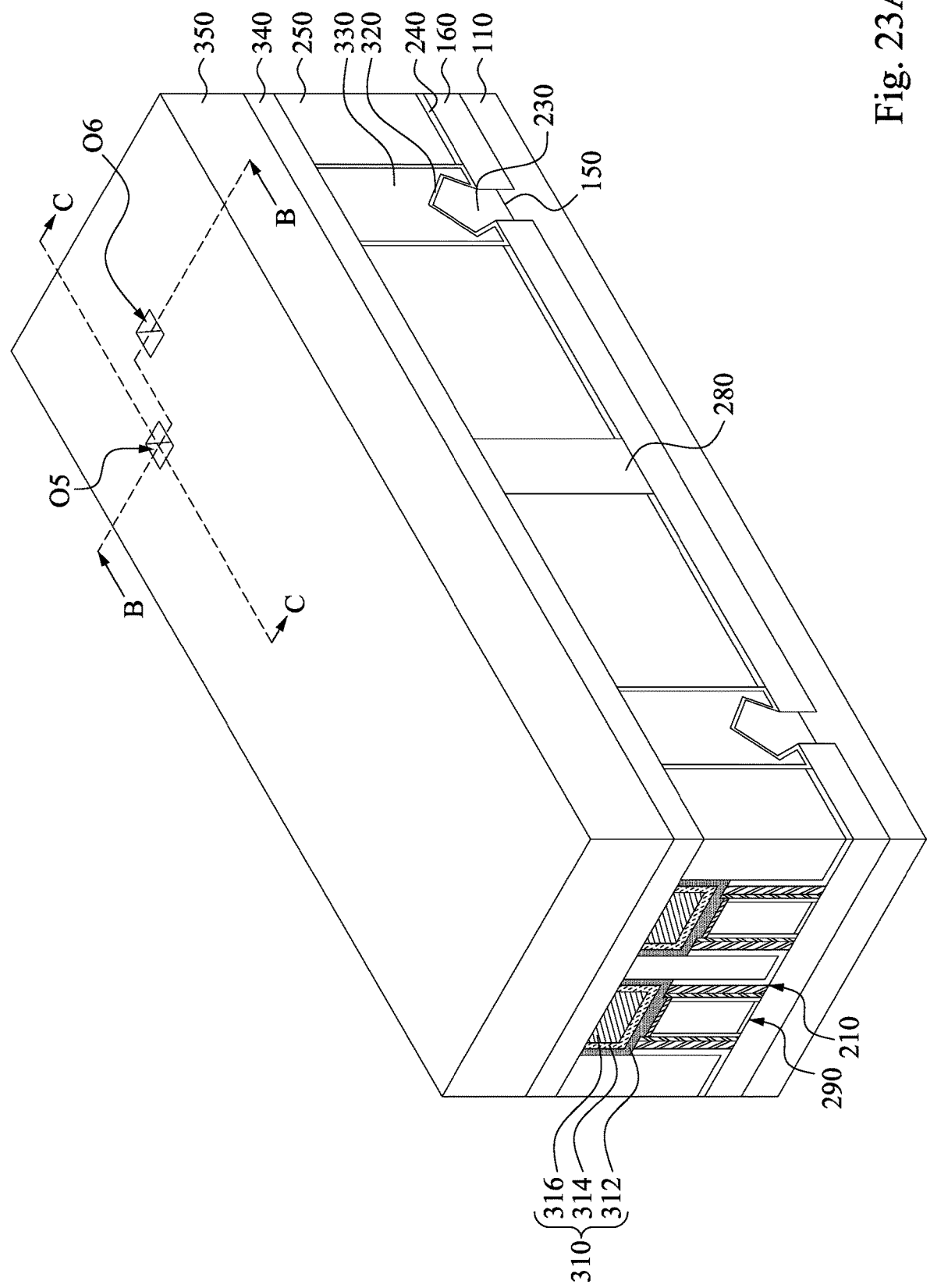
Figure 23B:
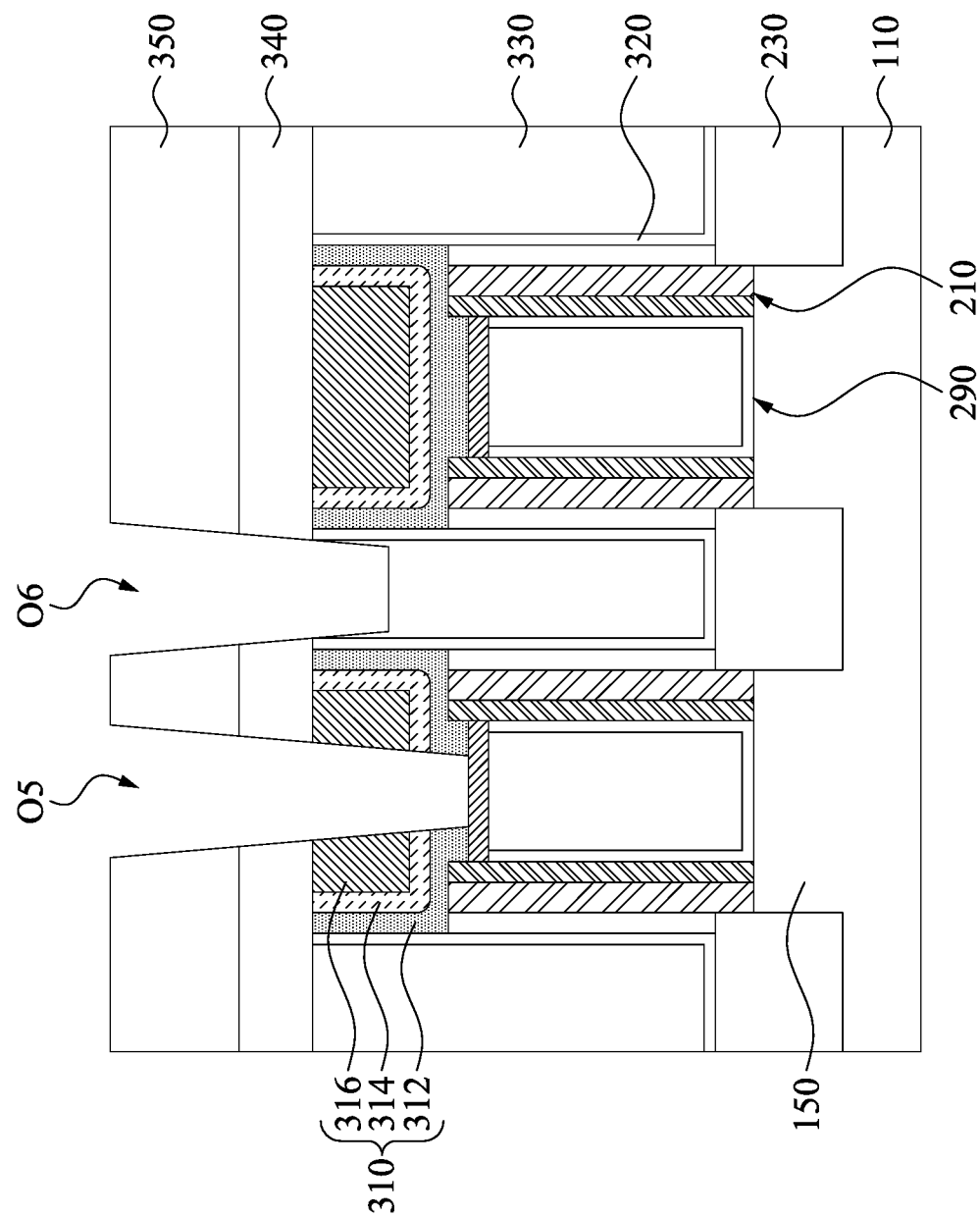
Figure 23C:
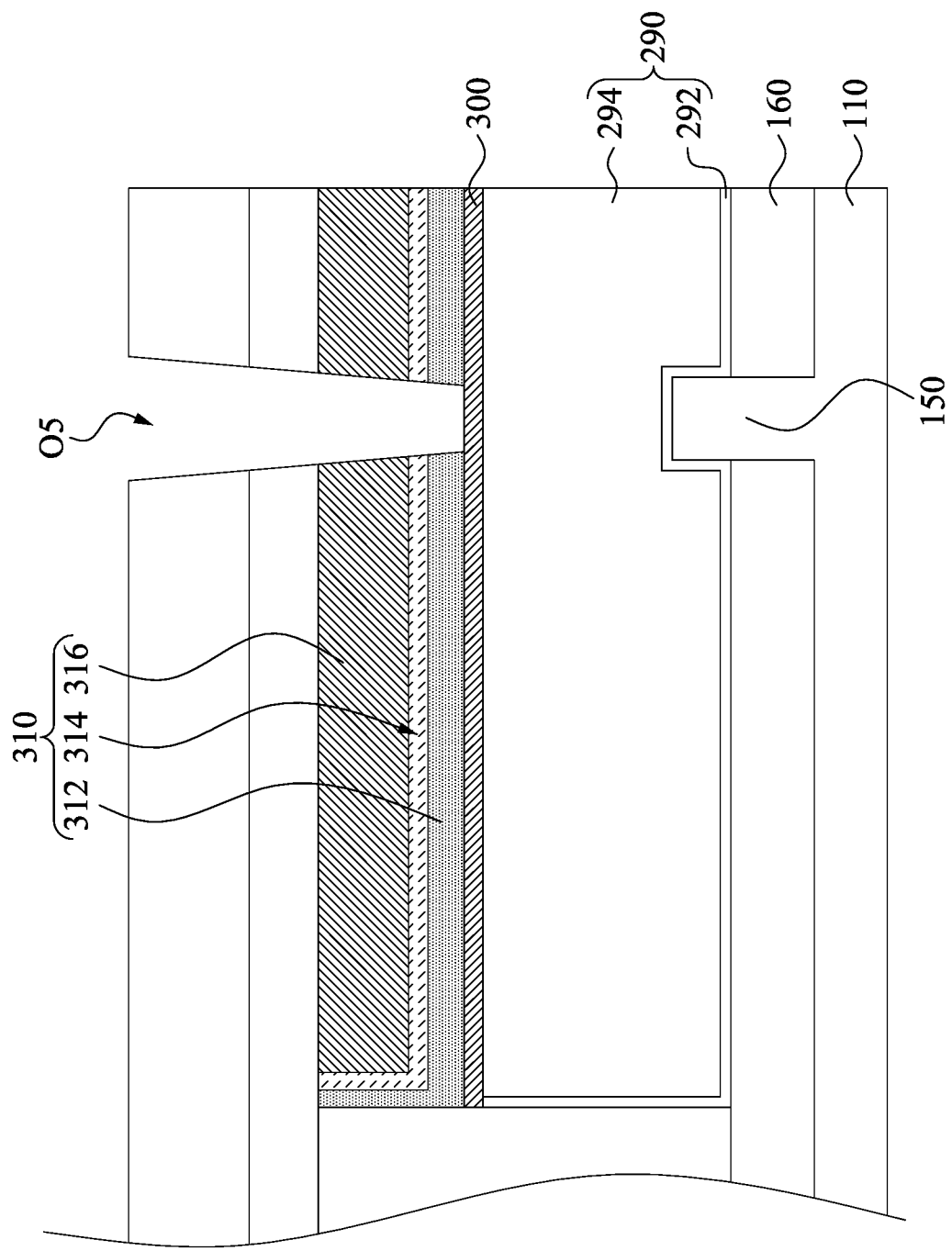

Reference is made to FIGS. 23A, 23B, and 23C, in which FIG. 23B is a cross-sectional view along line B-B of FIG. 23A, and FIG. 23C is a cross-sectional view along line C-C of FIG. 23A. An interlayer dielectric (ILD) layer 350 is formed over the CESL 340. In some embodiments, the ILD layer 350 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 350 may be formed using, for example, CVD, ALD, spin-on-glass (SOG) or other suitable techniques.

Then, an etching process is performed to form an opening O5 and an opening O6. The etching process may include one or more dry etching, wet etching, or combination thereof. In some embodiments, the opening O5 is formed by etching the ILD layer 350, the CESL 340, and the self-aligned insulating structure 310. On the other hands, the opening O6 is formed by etching the ILD layer 350, the CESL 340, and the conductive material 330. After the etching process, the first insulating layer 312, the sacrificial layer 314, and the second insulating layer 316 of the self-aligned insulating structure 310 are exposed from the opening $O_5$. On the other hand, the conductive material 330 is exposed from the opening O6. In some embodiments, the etchants of the etching process may include fluorine-containing etchant, such as $CF_4$, $SF_6$, $CH_2F_2$, $CHF_3$, and/or $C_2F_6$. For example, $C_4F_6$ may be used to etch the ILD layer 350, and $CH_3F$ may be used to etch the CESL 340. In some embodiments, a patterned mask may be initially formed over the substrate 110 that defines the desired positions of the openings O5 and O6. Then, the etching process, including dry etch, wet etch, or combination thereof, may be performed to remove the underlying structure through the patterned mask to form the openings O5 and O6. After the openings O5 and O6 are formed, the patterned mask may be removed. It is understood that the position of the openings O5 and O6 are merely used to explain. In practice, the openings O5 and O6 may be arranged at a desired position according to a design pattern.

Figure 24A:
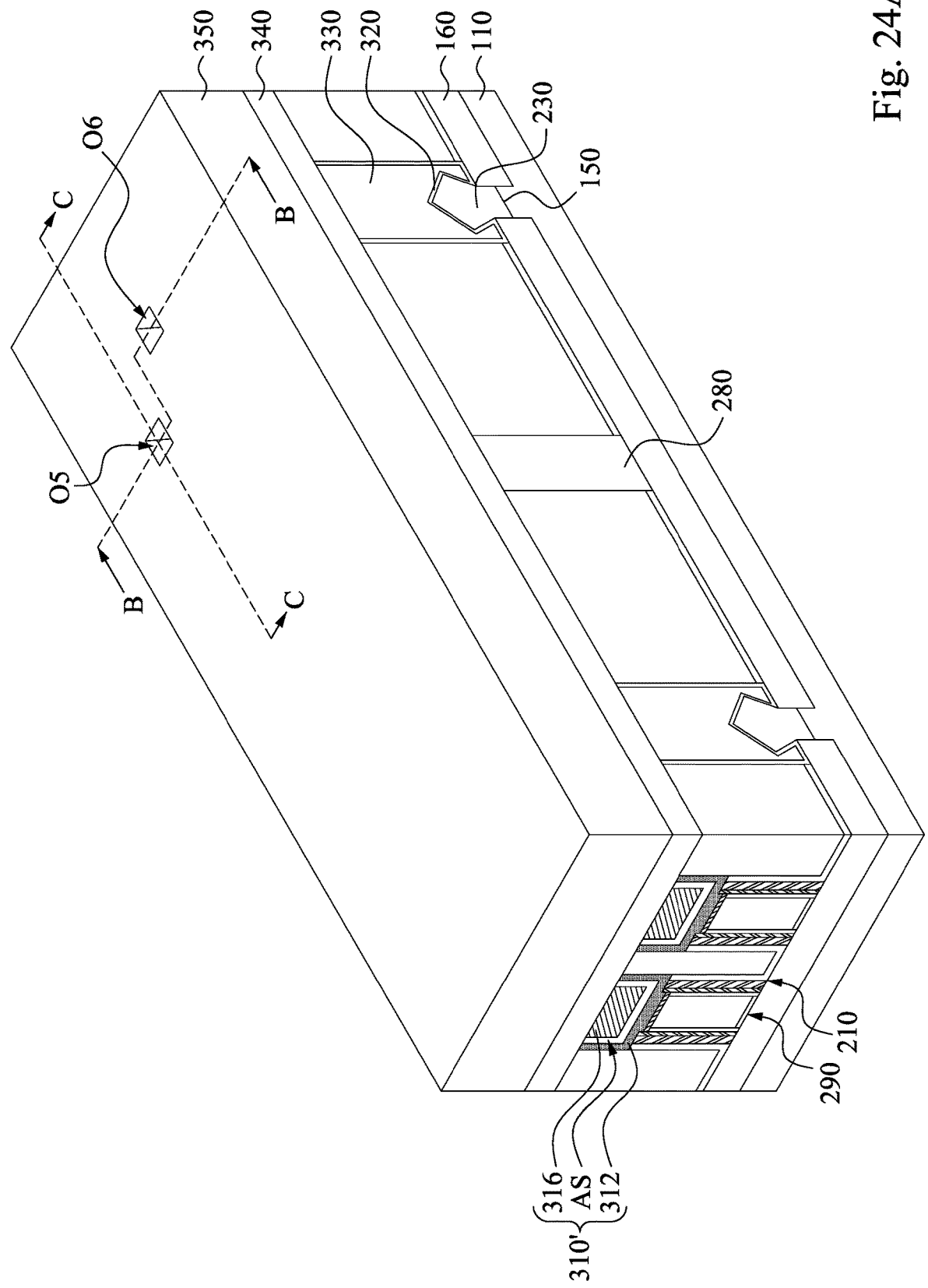
Figure 24B:
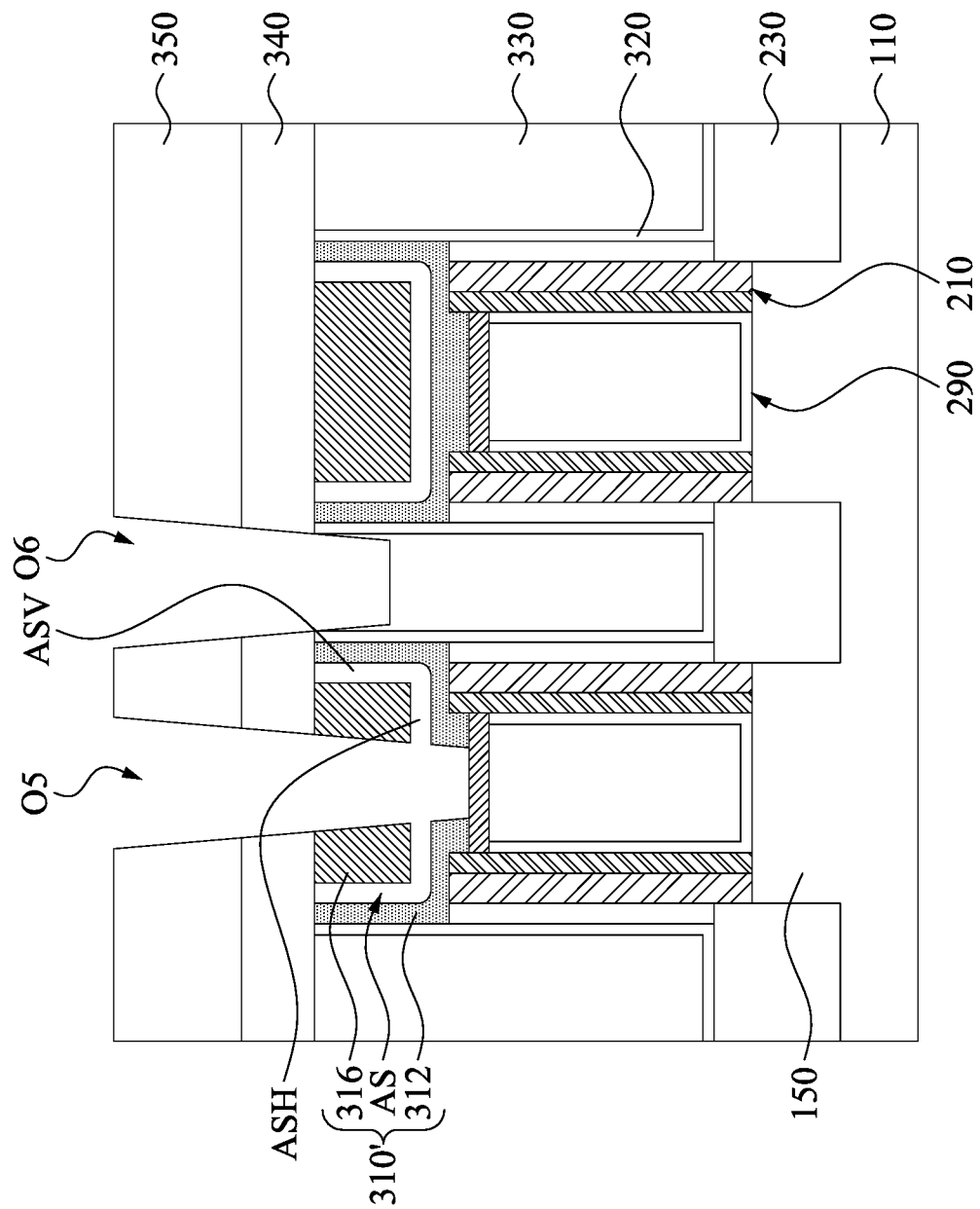
Figure 24C:
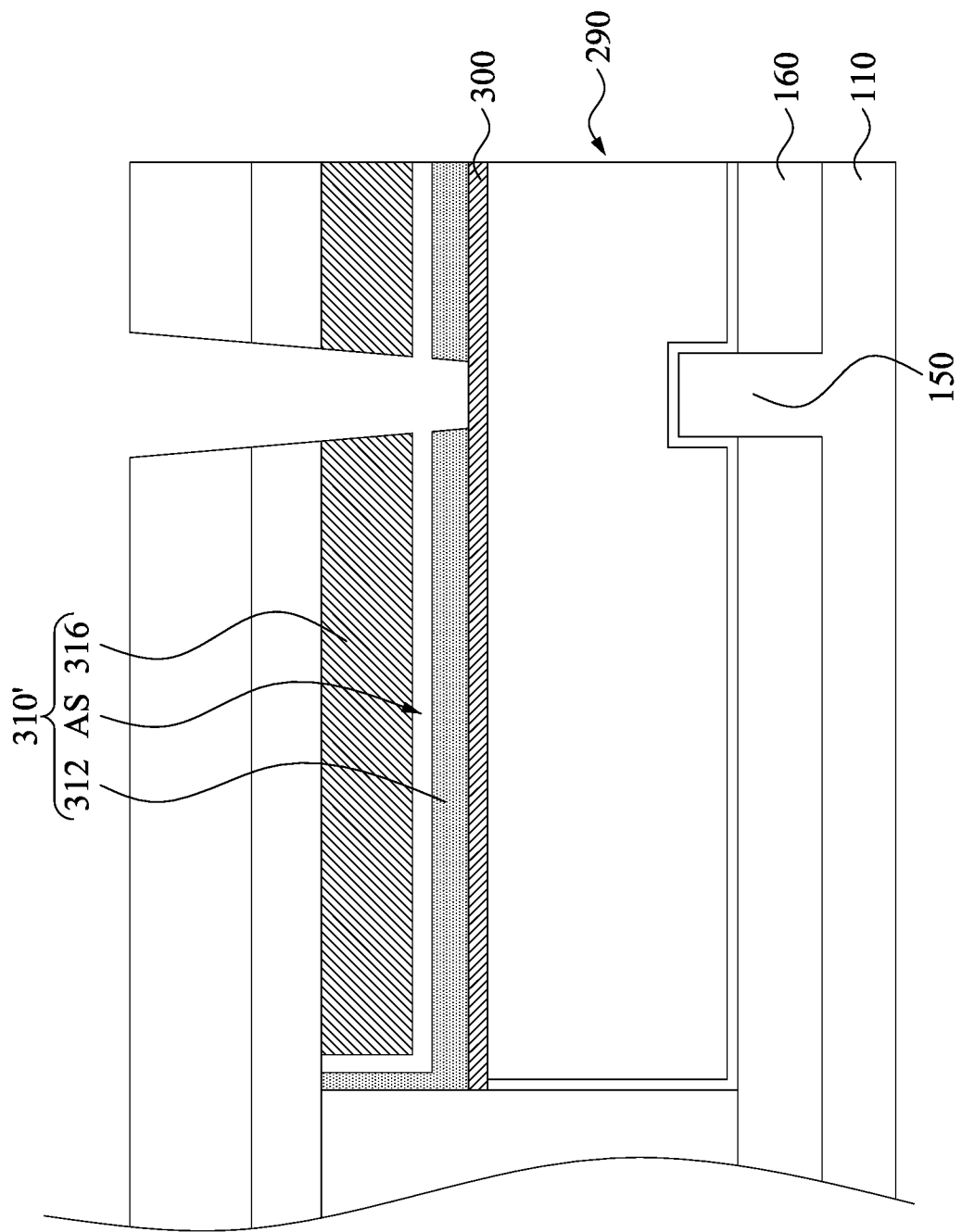
Figure 24D:
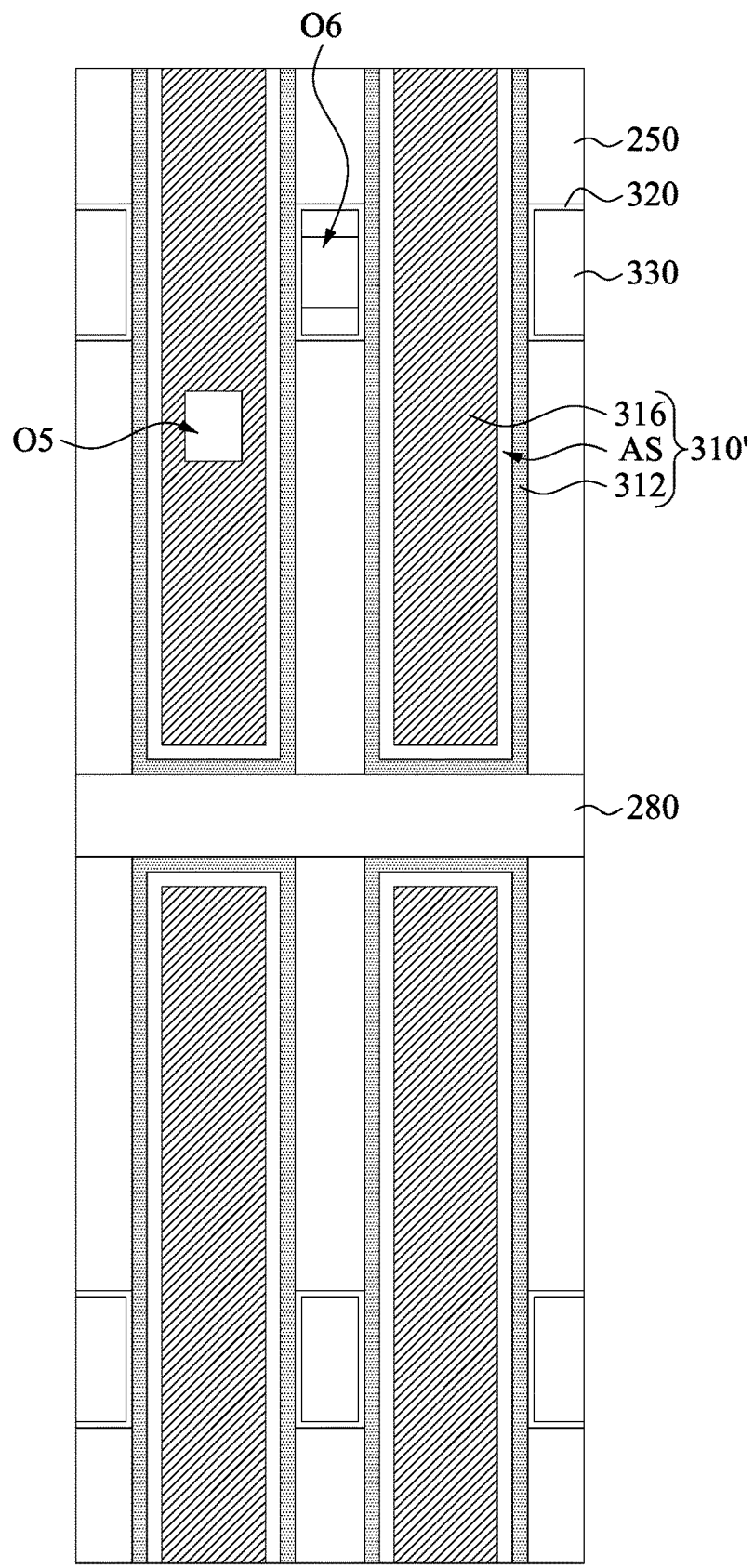

Reference is made to FIGS. 24A to 24D, in which FIG. 24B is a cross-sectional view along line B-B of FIG. 24A, FIG. 24C is a cross-sectional view along line C-C of FIG. 24A, and FIG. 24D is a top view of the structure in FIG. 24A but it zoom in to include the interlayer dielectric 250, the dielectric filling 280, the self-aligned insulating structure 310', the diffusion barrier layer 320, the conductive material 330. An etching process is performed to selectively remove the sacrificial layer 314 of the self-aligned insulating structure 310 (see FIGS. 23A to 23C). As a result, air slit AS are formed between the first insulating layer 312 of the self-aligned insulating structure 310 and the second insulating layer 316 of the self-aligned insulating structure 310. Stated another way, the first insulating layer 312 and the second insulating layer 316 are separated by the air slit AS. In some embodiments, the air slit AS and the opening O5 are in gaseous communication.

In some embodiments, the etchant of the etching process may include HBr, or the like. It is understood that the first insulating layer 312 and the second insulating layer 316 have higher etching resistance to the etching process than the sacrificial layer 314 (see FIGS. 23A to 23C). As a result, the etching process may selectively remove the sacrificial layer 314 and keep the first insulating layer 312 and the second insulating layer 316 substantially intact. Further, the etching process in FIGS. 23A to 23C and the etching process in FIGS. 24A to 24C may include different etchants.

After the air slit AS are formed, the first insulating layer 312, the air slit AS, and the second insulating layer 316 can be collectively referred to as self-aligned insulating structure 310'. The self-aligned insulating structure 310' is formed by removing the sacrificial layer 314 of the self-aligned insulating structure 310 (see FIGS. 23A to 23C), and thus the shape of the air slit AS substantially inherits the shape of the sacrificial layer 314. The air slit AS includes a vertical portion ASV and a horizontal portion ASH, in which the vertical portion ASV and the horizontal portion ASH are in gaseous communication and form an L-shape cross-section. In some embodiments, the vertical portion ASV of the air slit AS is above the gate spacers 210. Stated another way, the projection of the vertical portion ASV of the air slit AS onto the substrate 110 substantially overlaps the projection of the gate spacers 210 onto the substrate 110. On the other hand, the horizontal portion ASV of the air slit AS onto the substrate 110 substantially overlaps the projection of the gate spacers 210 onto the substrate 110. In some other embodiments, the projection of vertical portion ASV of the air slit AS onto the substrate 110 does not overlap the projection of the gate stacks 290 onto the substrate 110. In some embodiments, a portion of the bottom surface of the CESL 340 is exposed in the vertical portion ASV of the air slit AS.

As mentioned before, the thickness of the sacrificial layer 314 (see FIGS. 23A to 23C) is in a range from about 1 nm to about 3 nm. As a result, the thickness of the air slit AS is also in a range from about 1 nm to about 3 nm. For example, the air slit AS is about 2 nm. If the thickness of the sacrificial layer 314 is smaller than 1 nm, the sacrificial layer 314 is too thin such that the etchant is hard to flow into the space between the first insulating layer 312 and the second insulating layer 316, which in turn will affect the formation of the air slit AS. On the other hand, if the thickness of the sacrificial layer 314 is greater than 3 nm, the sacrificial layer 314 may be too thick and further reduce the thickness of the second insulating layer 316 between the sacrificial layer 314 and the opening O5. As such, during the etching process in FIG. 23A and, the second insulating layer 316 may be etched away and expose the sacrificial layer 314, which in turn will affect the formation of the air slit AS.

As mentioned before, since the self-aligned insulating structure 310' is formed to have a width greater than the width of the gate stack 290. The enlarged width of the self-aligned insulating structure 310' will shift the vertical portion ASV of the air slit AS from the opening O5. If the width of the self-aligned insulating structure 310' is too narrow, the sacrificial layer 314 may be etched away during the etching process in FIGS. 23A to 23C, which will affect the formation of the air slit AS.

In the present disclosure, the first insulating layer 312 and the second insulating layer 316 have large dielectric constants, for example, greater than 1. On the other hand, the self-aligned insulating structure 310' includes the air slit AS that has a dielectric constant equal to 1 ($k_{air}=1$), which is lower than the dielectric constant of the first insulating layer 312 and the second insulating layer 316. Thus, the equivalent dielectric constant of the self-aligned insulating structure 310' may be reduced by inserting the air slit AS. As a result, the overall capacitance of the self-aligned insulating structure 310' may be reduced, which in turn will reduce the RC delay and further improve the device performance.

Figure 25A:
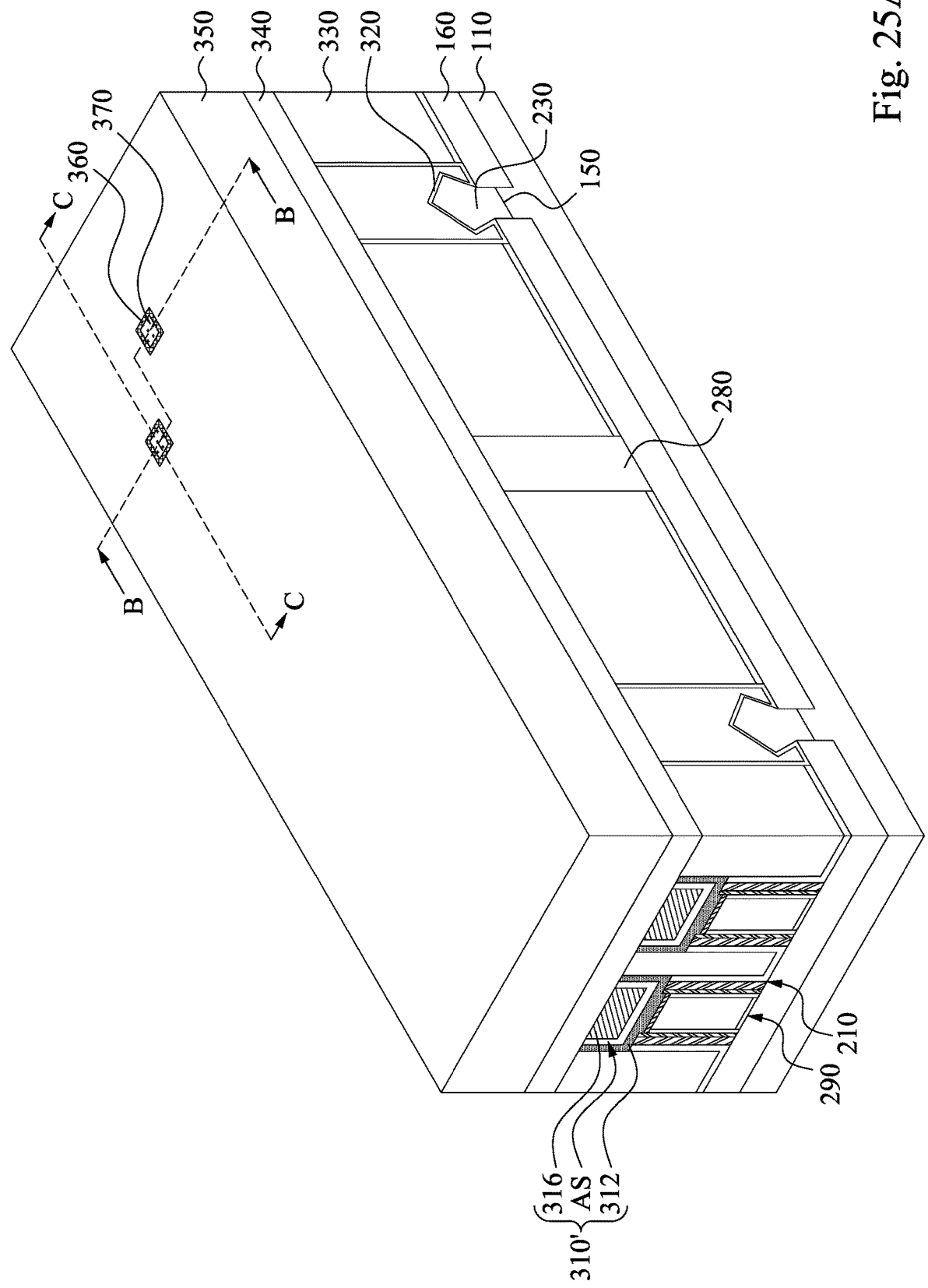

Reference is made to FIGS. 25A and 25B, in which FIG. 25B is a cross-sectional view along line B-B of FIG. 25A. A barrier layer 360 and a conductive layer 370 are formed in the openings O5 and O6. The barrier layer 360 is blanket formed over the ILD layer 350, and the conductive layer 370 is formed over the barrier layer 360. After the formation of the barrier layer 360 and the conductive layer 364, a planarization process, such as CMP, is performed to remove excessive materials of the barrier layer 360 and the conductive layer 370 until the ILD layer 350 is exposed. As a result, the barrier layer 360 and the conductive layer 370 remain in the openings O5 and O6 can be referred to as conductive via 380. As mentioned before, because the air slit AS is gaseously communicated with the opening O5, material of the barrier layer 360 may flow into and seal the air slit AS. Accordingly, the conductive via 380 is exposed in the air slit AS. Accordingly, the barrier layer 360 includes a protrusion portion embedded between the first insulating layer 312 and the second insulating layer 316, and the protrusion portion is aligned with the air slit AS. Thus, the protrusion portion of the barrier layer 360 and the air slit AS have substantially the same thickness. Further, one end of the air slit AS is at the conductive via 380, and the other end of the air slit AS is at the CESL 340. In the present disclosure, one end of the air slit AS is covered by the CESL 340, and the other end of the air slit AS is blocked by the protrusion portion 362P of the barrier layer 360, and thus the air slit AS can be protected during the subsequent process, such that other material would not fill into the air slit AS. In some embodiments, the barrier layer 360 and the conductive layer 370 may be collectively referred to as a conductive via 380.

In some embodiments, the barrier layer 360 is a metal or metal alloy layer. The barrier layer 360 may include Co, Ag, Al, Zn, Ca, Au, Mg, W, Mo, Ni, Cr, or combinations thereof, which may be deposited by using e.g., PVD, CVD, PECVD, LPCVD, or the like. In some embodiments, the conductive layer 370 includes TiN, TaN, Ta, Ti, Hf, Zr, Ni, W, Co, Cu, or Al. In some embodiments, the conductive layer 370 may be formed by CVD, PVD, plating, ALD, or other suitable technique. The conductive layer 370 adheres to the barrier layer 360. In some embodiments, the conductive layer 370 may be formed via a bottom-up approach. The bottom-up approach is similar to those described in FIGS. 17A to 17C, and thus relevant detail will not be repeated for simplicity.

Figure 25C:
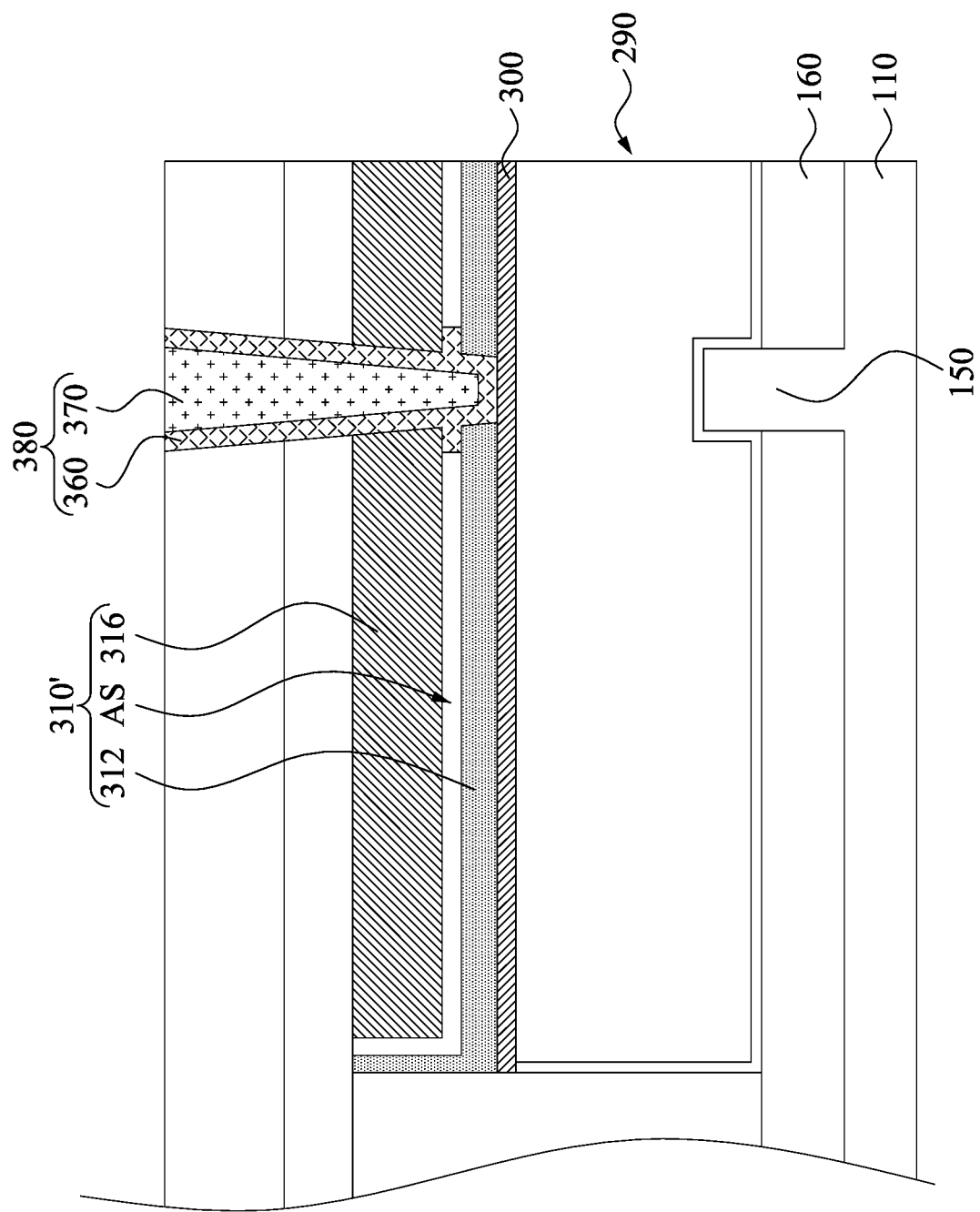
Figure 26A:
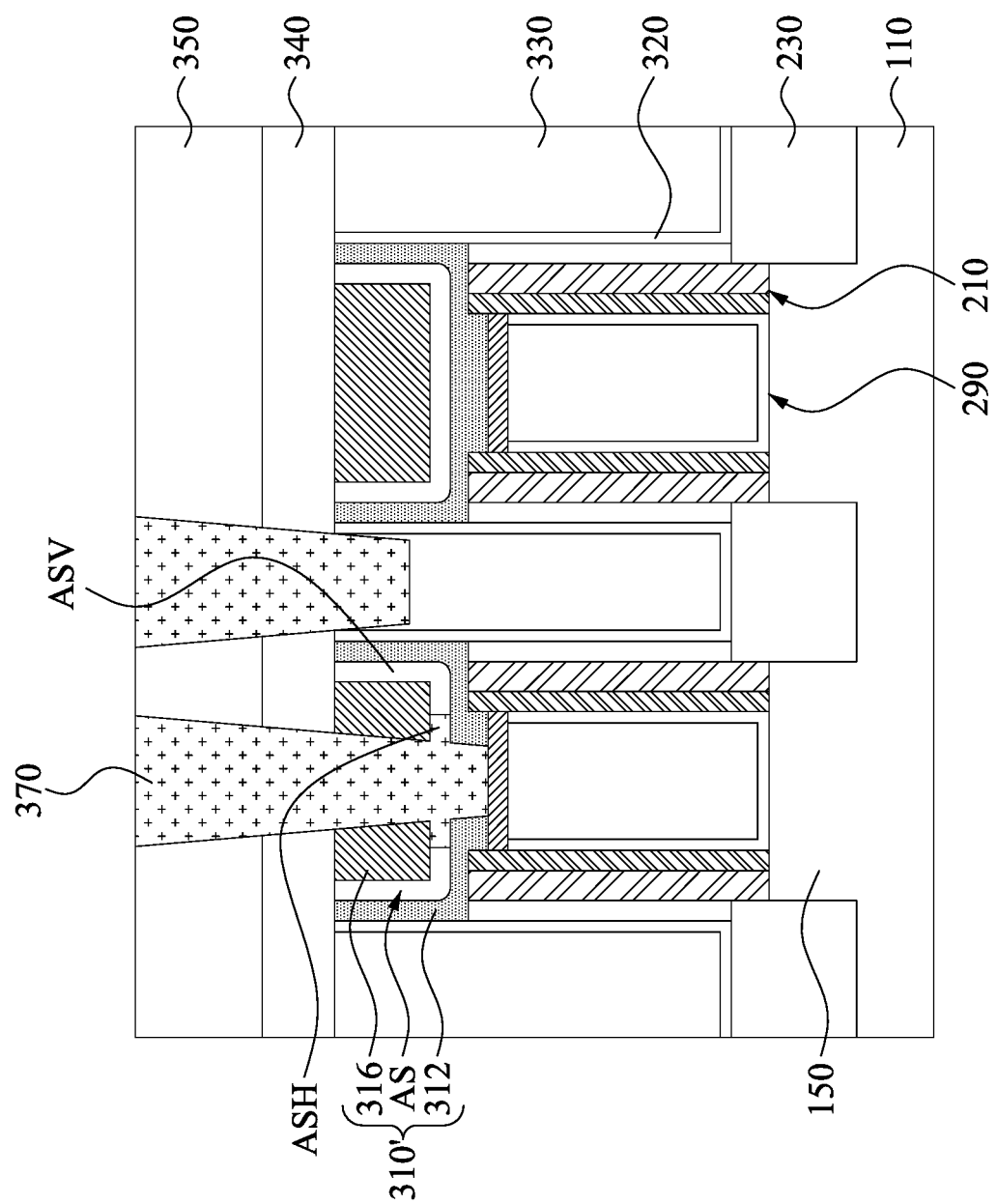
FIGS. 26A and 26B illustrate a semiconductor device at various stages in accordance with some embodiments of the present disclosure.
Figure 26B:
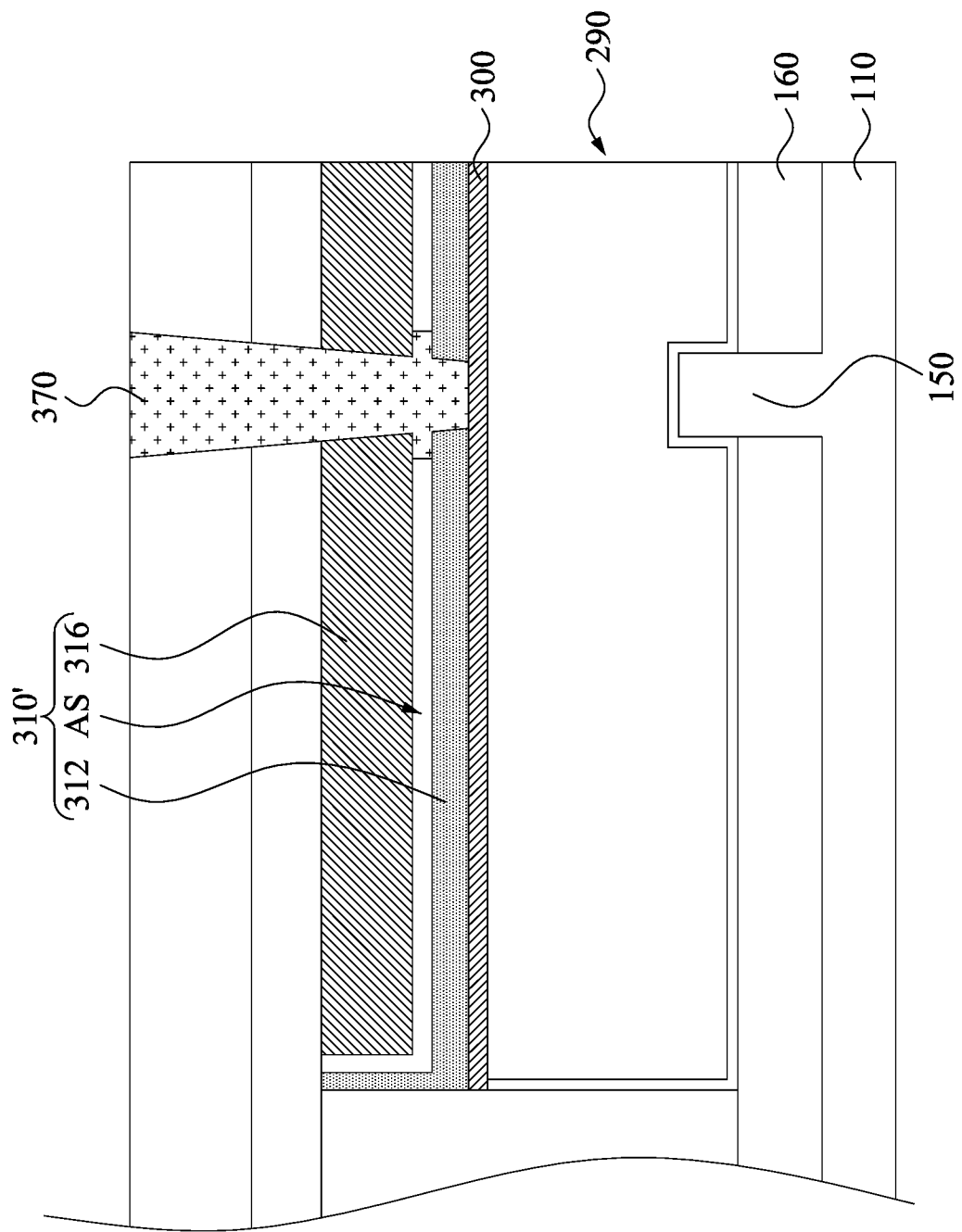

FIGS. 26A and 26B illustrate a semiconductor device at various stages in accordance with some embodiments of the present disclosure. FIGS. 26A and 26B are similar to those described in FIG. 1 to FIG. 25C, and thus relevant structural detail will not be repeated for simplicity. FIGS. 26A and 26B are different from structure of FIG. 1 to FIG. 25C, in that the barrier layer 360 of FIGS. 25A to 25C is omitted. As a result, the conductive layer 370 is formed in the opening O5 (see FIGS. 24A to 24D), and thus a portion of the conductive layer 370 may flow into the air slit As and between the first insulating layer 312 and the second insulating layer 316. The structure of the conductive layer 370 is similar to the conductive via 380 described in FIGS. 25A to 25C, and will not be repeated hereinafter. In some embodiments shown in FIGS. 26A and 26C, the conductive layer 370 may be referred to as conductive via.

Figure 27A:
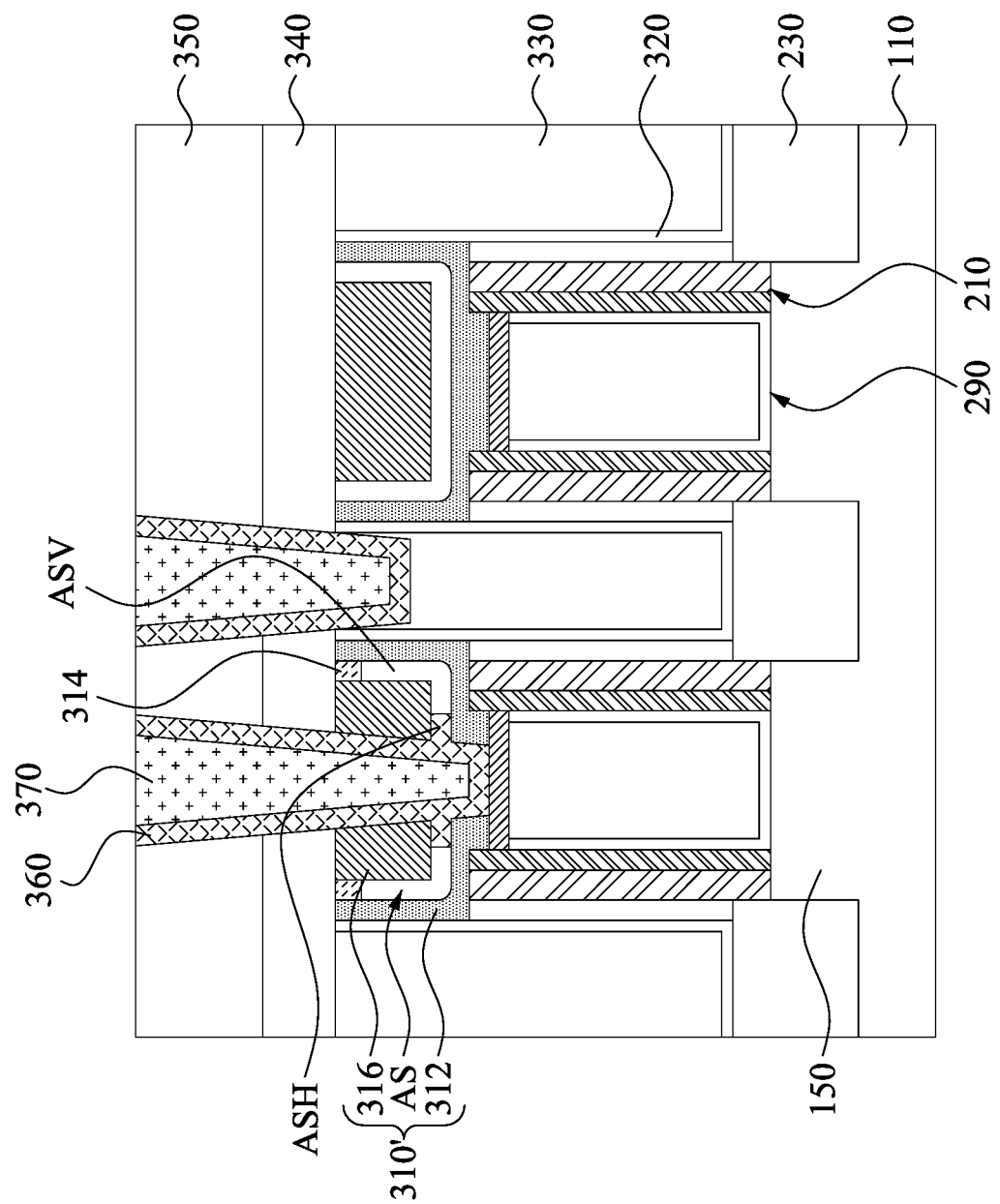
FIGS. 27A and 27B illustrate a semiconductor device at various stages in accordance with some embodiments of the present disclosure.
Figure 27B:
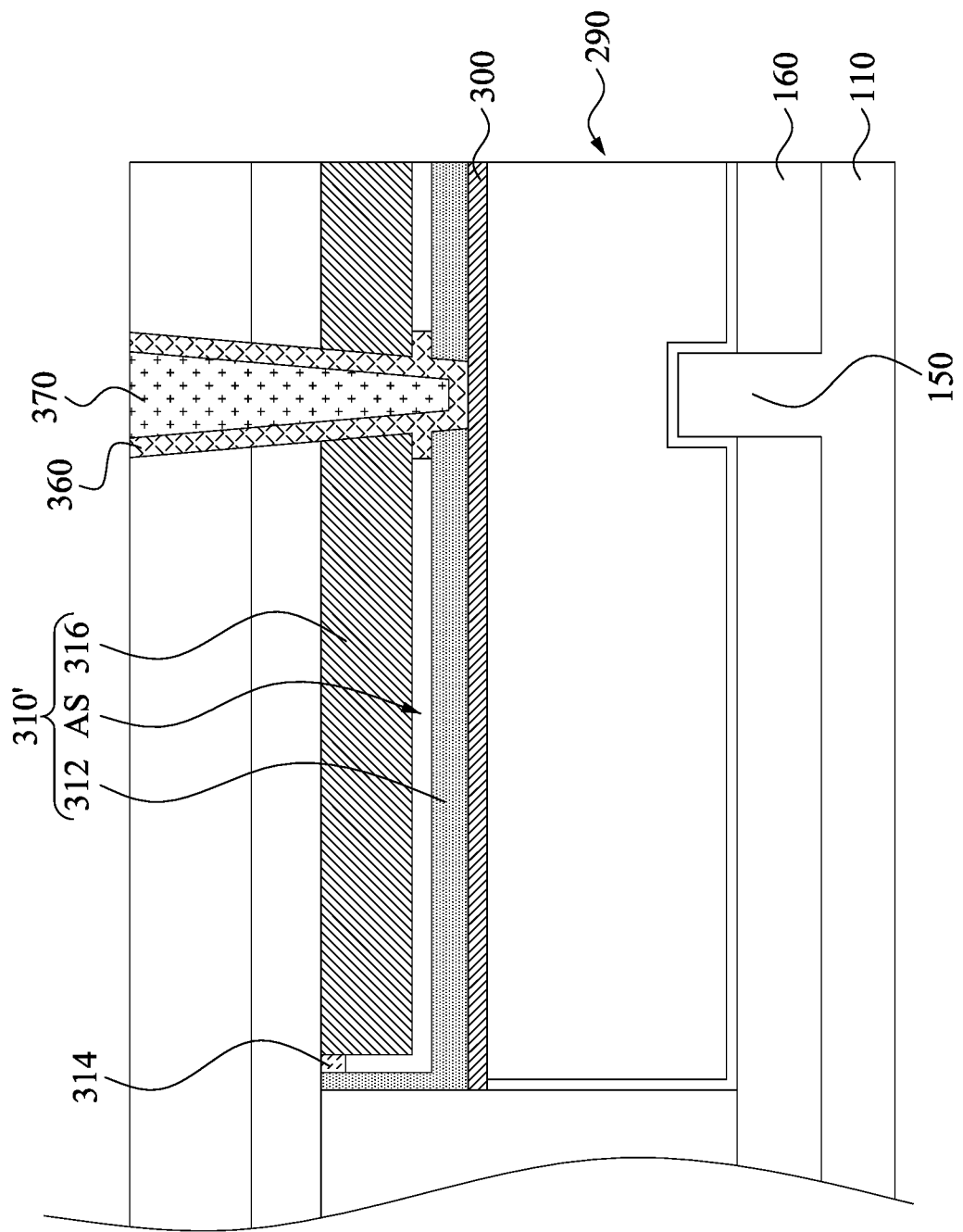

FIGS. 27A and 27B illustrate a semiconductor device at various stages in accordance with some embodiments of the present disclosure. FIGS. 26A and 26B are similar to those described in FIG. 1 to FIG. 25C, and thus relevant structural detail will not be repeated for simplicity. FIGS. 26A and 26B are different from structure of FIG. 1 to FIG. 25C, in that during the removal of the sacrificial layer 314 in FIGS. 24A to 24D, the parts of the sacrificial layer 314 are not removed, and thus residues of the sacrificial layer 314 may remain between the first insulating layer 312 and the second insulating layer 316 and in contact with the CESL 340. In some embodiments, the residues of the sacrificial layer 314 can be referred to as insulating residues.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that an air slit is formed in a self-aligned insulating structure, and thus the equivalent capacitance of the self-aligned insulating structure may be reduced, thereby reducing the RC delay and will improve the device performance. Moreover, since the air slit is formed by removing a sacrificial layer between two insulating layers, the air slit may inherit the shape of the sacrificial layer, and thus it is easier to control the size of the air slit and further control the equivalent capacitance of the insulating structure. Further, because one end of the air slit is covered by a dielectric layer, and the other end of the air slit is blocked by a conductive via, and thus the air slit can be protected during subsequent process, such that the air slit would not be destroyed by material filling or etching.

In some embodiments of the present disclosure, a semiconductor device includes a substrate, a gate stack over the substrate, an insulating structure over the gate stack, a conductive via in the insulating structure, and an contact etch stop layer (CESL) over the insulating structure. The insulating structure has an air slit therein. The conductive via is electrically connected to the gate stack. A portion of the CESL is exposed in the air slit.

In some embodiments of the present disclosure, a semiconductor device includes a substrate, a gate stack over the substrate, a conductive via over the gate stack, and an insulating structure around the conductive via. The insulating structure has an air slit extending in the insulating structure and having a first end at the conductive via.

In some embodiments of the present disclosure, A method includes forming a gate stack over a substrate; forming in sequence a first insulating layer, a sacrificial layer and a second insulating layer over the gate stack; forming an opening through the first insulating layer, the sacrificial layer, and the second insulating layer; selectively etching the sacrificial layer to form an air slit between the first insulating layer and the second insulating layer; and forming a conductive via in the opening to seal the air slit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a gate stack over the substrate;
a gate spacer on a sidewall of the gate stack, wherein the gate spacer has a top surface and an inner sidewall with a first portion and a second portion, the first portion in contact with the gate stack;
a conductive via over the gate stack; and
an insulating structure around the conductive via and having a first insulating portion, a second insulating portion, and an air slit extending in the insulating structure, the conductive via being exposed to a first end of the air slit and a second end of the air slit separated from the conductive via at least in part by the first insulating portion, and the second insulating portion extending from the top surface of the gate spacer to laterally cover the second portion of the inner sidewall of the gate spacer.

2. The semiconductor device of claim 1, wherein the air slit has an L-shape cross-section.

3. The semiconductor device of claim 1, wherein the insulating structure has a stepped bottom surface.

4. The semiconductor device of claim 1, further comprising a semiconductor residue disposed at one end of the air slit.

5. The semiconductor device of claim 4, wherein the semiconductor residue is made of amorphous silicon.

6. The semiconductor device of claim 1, wherein the conductive via has a protrusion aligned with the air slit.

7. The semiconductor device of claim 1, wherein a portion of the air slit is over the gate spacer.

8. A semiconductor device, comprising:
a substrate;
a gate stack over the substrate;
a plurality of gate spacers on opposite sidewalls of the gate stack, wherein each of the gate spacers has a top surface and an inner sidewall with a first portion and a second portion, the first portion in contact with the gate stack;
a conductive via over the gate stack; and
an insulating structure around the conductive via and having a first insulating portion, a second insulating portion, and an air slit, wherein the air slit comprises a horizontal portion and a vertical portion connected to the horizontal portion, and the vertical portion is higher than the horizontal portion, and wherein the conductive via is exposed to the horizontal portion of the air slit, the vertical portion of the air slit is separated from the conductive via at least in part by the first insulating portion, and the second insulating portion extends from the top surfaces of the gate spacers to laterally cover the second portion of the inner sidewalls of the gate spacers.

9. The semiconductor device of claim 8, wherein the insulating structure extends between the gate spacers.

10. The semiconductor device of claim 9, wherein the first insulating portion of the insulating structure is separated from the gate spacers.

11. The semiconductor device of claim 9, wherein a bottommost surface of the conductive via is lower than the horizontal portion of the air slit.

12. The semiconductor device of claim 8, wherein a top end of the vertical portion of the air slit is lower than a top surface of the insulating structure.

13. A semiconductor device, comprising:
a substrate;
a gate stack over the substrate;
a gate spacer on a sidewall of the gate stack, wherein the gate spacer has a top surface and an inner sidewall with a first portion and a second portion, the first portion in contact with the gate stack;
a conductive layer over the gate stack;
an insulating structure over and in contact with the conductive layer, wherein the insulating structure has a first insulating portion, a second insulating portion, and an air slit therein;
a conductive via extending through the insulating structure and in contact with the conductive layer, the conductive via being exposed to a first end of the air slit and a second end of the air slit separated from the conductive via at least in part by the first insulating portion, and the second insulating portion extending from the top surface of the gate spacer to laterally cover the second portion of the inner sidewall of the gate spacer; and
a contact etch stop layer (CESL) over the insulating structure and surrounding the conductive via.

14. The semiconductor device of claim 13, wherein a portion of the air slit in the insulating structure is over the gate spacer.

15. The semiconductor device of claim 13, wherein the air slit has an L-shaped profile.

16. The semiconductor device of claim 13, wherein a portion of the conductive via is exposed to a horizontal portion of the air slit.

17. The semiconductor device of claim 13, wherein the first insulating portion and the second insulating portion are separated by the air slit.

18. The semiconductor device of claim 17, wherein the conductive via comprises a protrusion portion between the first insulating portion and the second insulating portion.

19. The semiconductor device of claim 18, wherein the protrusion portion of the conductive via and the air slit have substantially the same thickness.

20. The semiconductor device of claim 13, wherein the conductive layer is a barrier layer between the gate stack and the insulating structure.

* * * * *